(12) United States Patent
Yamamoto et al.

(10) Patent No.: US 7,965,508 B2
(45) Date of Patent: Jun. 21, 2011

(54) COOLING DEVICE FOR ELECTRONIC COMPONENT AND POWER CONVERTER EQUIPPED WITH THE SAME

(75) Inventors: Takeshi Yamamoto, Aichi-ken (JP); Seiji Inoue, Aichi-ken (JP); Yoshiaki Fukatsu, Nagoya (JP)

(73) Assignee: Denso Corporation, Kariya (JP)

( * ) Notice: Subject to any disclaimer, the term of this patent is extended or adjusted under 35 U.S.C. 154(b) by 426 days.

(21) Appl. No.: 12/056,072

(22) Filed: Mar. 26, 2008

(65) Prior Publication Data
US 2008/0239663 A1    Oct. 2, 2008

(30) Foreign Application Priority Data

Mar. 27, 2007   (JP) .................................. 2007-082587
Oct. 8, 2007    (JP) .................................. 2007-262805

(51) Int. Cl.
*H05K 7/20*    (2006.01)
(52) U.S. Cl. ........ 361/699; 361/691; 361/704; 361/719; 257/707; 174/15.1
(58) Field of Classification Search .................. 361/676, 361/689, 699, 700, 704, 707, 719, 679.47, 361/697.54, 691, 697, 690
See application file for complete search history.

(56) References Cited

U.S. PATENT DOCUMENTS

| | | | |
|---|---|---|---|
| 3,921,201 A * | 11/1975 | Eisele et al. .................. 257/714 |
| 4,268,850 A * | 5/1981 | Lazarek et al. ................ 257/714 |
| 4,392,153 A * | 7/1983 | Glascock et al. ............. 257/746 |
| 6,542,365 B2 | 4/2003 | Inoue | |
| 6,845,012 B2 | 1/2005 | Ohkouchi | |
| 7,027,302 B2 | 4/2006 | Inoue | |
| 7,042,725 B2 * | 5/2006 | Martin et al. ................. 361/699 |
| 7,106,592 B2 | 9/2006 | Inoue et al. | |
| 7,248,478 B2 | 7/2007 | Inoue | |
| 7,250,674 B2 | 7/2007 | Inoue | |
| 7,656,016 B2 * | 2/2010 | Yoshimatsu et al. .......... 257/686 |
| 2001/0033477 A1 | 10/2001 | Inoue et al. | |
| 2002/0159237 A1 * | 10/2002 | Patel et al. .................... 361/719 |
| 2003/0090873 A1 | 5/2003 | Ohkouchi | |

(Continued)

FOREIGN PATENT DOCUMENTS

JP           62-252157           11/1987
(Continued)

OTHER PUBLICATIONS

Japanese Office Action dated Dec. 9, 2008 issued in corresponding Japanese Application No. 2007-262805, with English translation.

*Primary Examiner* — Jayprakash N Gandhi
*Assistant Examiner* — Courtney Smith
(74) *Attorney, Agent, or Firm* — Nixon & Vanderhye PC

(57) ABSTRACT

A cooling device for cooling an electronic component (semiconductor module) includes a cooling tube adapted to be disposed in contact with the electronic component and having an internal coolant flow channel for the passage therethrough of a cooling medium, and a high-pressure tube disposed adjacent to a surface of the cooling tube that faces away from the electronic component, the high-pressure tube having a hollow interior that can be filled with a high-pressure fluid having a pressure higher than that of the cooling medium. An electric power conversion device comprised of a plurality of semiconductor modules and the cooling device as means for cooling the semiconductor modules is also disclosed.

14 Claims, 15 Drawing Sheets

U.S. PATENT DOCUMENTS

| | | |
|---|---|---|
| 2004/0144996 A1 | 7/2004 | Inoue |
| 2005/0040515 A1 | 2/2005 | Inoue et al. |
| 2005/0103486 A1* | 5/2005 | Demuth et al. ............... 165/174 |
| 2006/0120047 A1 | 6/2006 | Inoue |
| 2006/0165570 A1* | 7/2006 | Knopf et al. .................. 422/224 |
| 2006/0232939 A1* | 10/2006 | Inoue ............................ 361/704 |
| 2007/0044952 A1 | 3/2007 | Kuno et al. |
| 2007/0076355 A1* | 4/2007 | Oohama ....................... 361/676 |

FOREIGN PATENT DOCUMENTS

| | | |
|---|---|---|
| JP | 2001-320005 | 11/2001 |
| JP | 2002-026215 | 1/2002 |
| JP | 2004-335777 | 11/2004 |
| JP | 2005-191082 | 7/2005 |
| JP | 2005-333008 | 12/2005 |
| JP | 2006-313848 | 11/2006 |

* cited by examiner

COOLING DEVICE FOR ELECTRONIC COMPONENT AND POWER CONVERTER EQUIPPED WITH THE SAME

CROSS REFERENCE TO RELATED APPLICATION

The present application is based on and claims priority from Japanese Patent Applications No. 2007-82587, filed Mar. 27, 2007, and No. 2007-262805, filed Oct. 8, 2007, the contents of which are incorporated herein by reference.

BACKGROUND OF THE INVENTION

1. Field of the Invention

The present invention relates to a cooling device for cooling an electronic component such as a semiconductor module, and a power conversion device or converter equipped with the cooling device.

2. Description of the Related Art

Electric power conversion devices, such as inverters, converters and so on, that are equipped with a plurality of semiconductor modules with semiconductors incorporated therein and a cooling device for cooling the semiconductor modules are known heretofore.

One example of such known power conversion devices is disclosed in Japanese Patent Laid-open Publication (JP-A) No. 2001-320005 (corresponding to U.S. Pat. No. 7,248,478). The disclosed power conversion device includes a pair of cooling tubes disposed on both sides of a semiconductor module. The cooling tubes are urged toward each other by means of presser plates and a spring member so that the cooling tubes come closely in contact with the semiconductor module.

However, due to the use of the presser plates and the spring member, the spacing between a stacked or laminated array of semiconductor modules is relatively large, making it difficult to downsize the power conversion device.

Japanese Patent Laid-open Publication (JP-A) No. 2005-191082 (corresponding to U.S. Patent Application Publication No. 2007/0044952) shows another example of the known power conversion devices, wherein semiconductor modules and cooling tubes are disposed alternately so as to reduce the spacing between the semiconductor modules stacked or laminated together with the cooling devices disposed therebetween. A laminated assembly as a whole is compressed in a laminated direction (thickness direction of semiconductor modules) so that the semiconductor modules and the cooling tubes closely contact each other.

With this arrangement, since the laminated assembly, which is composed of a plurality of semiconductor modules and a plurality of cooling tubes, is compressed by only one pressure means, the compressive force or pressure acting between the semiconductor modules and the cooling devices is uniform throughout the laminated assembly. It may occur, however, that the plural semiconductor modules are not uniform in heat value and hence require a different cooling efficiency provided for each of the semiconductor module. In this instance, the foregoing arrangement is not convenient because the pressure acting between the semiconductor modules and the cooling tubes is uniform throughout the assembly. If the pressure is set to be suitable for a semiconductor module having a maximum heat value, an excessively large pressure will be applied to the entire laminated assembly.

The power conversion device shown in JP 2005-191082A is arranged to change the flow rate of a cooling medium flowing through the cooling tubes in accordance with the heat values of the associated semiconductor modules. This arrangement, however, lacks versatility because of the design requirements in which a thermal balance must be provided for a plurality of different circuit control patterns in view of the thermal interference between the adjacent semiconductor modules and the difference in flow distribution of the cooling medium.

Still another example of the known power conversion devices is disclosed in Japanese Patent Laid-open Publication (JP-A) No. 2006-313848. The disclosed power conversion device has an arrangement to supply a high-pressure cooling medium or coolant through a cooling tube so that the cooling tube is expanded and comes closely in contact with electronic components. This arrangement is, however, difficult to realize because the entire coolant circulation path requires a high pressure-proof design. Furthermore, since the pressure applied from the cooling tube to the respective electronic components is uniform throughout the electronic component and cooling tube assembly, the same problem as the one discussed above with respect to JP 2005-191082A will occur.

SUMMARY OF THE INVENTION

With the foregoing difficulties in view, an object of the present invention is to provide a cooling device, which is capable of preventing thermal interference between the adjacent electronic components and also is easy to regulate the cooling efficiency of the electronic components.

Another object of the present invention is to provide a power conversion device or converter equipped with the cooling device.

According to a first aspect of the invention, there is provided a cooling device for cooling an electronic component, comprising: a cooling tube adapted to be disposed in contact with the electronic component and having an internal coolant flow channel for the passage therethrough of a cooling medium; and a high-pressure tube disposed adjacent to a surface of the cooling tube that faces away from the electronic component, the high-pressure tube having a hollow interior that can be filled with a high-pressure fluid having a pressure higher than that of the cooling medium.

With the cooling device thus arranged, the cooling tube is forced against the electronic component by the pressure of the high-pressure fluid supplied in the high-pressure tube. More specifically, by virtue of the radial expansion of the high-pressure tube being filled with the high-pressure fluid, a force or pressure is exerted from the high-pressure tube onto the cooling tube in a direction to urge the cooling tube toward the electronic component. The thus urged cooling tube is able to sufficiently follow or fit the surface configuration of a heat radiating surface of the electronic component with the result that the thermal resistance between the cooling tube and the electronic component is reduced and the cooling efficiency of the cooling device is increased.

Even when the parallelism of both heat radiating surfaces of the electronic component is relatively low or either heat radiating surface has a warp, the cooling tube is able to follow the surface configuration of each heat radiating surface to thereby take up or minimize a clearance between the electronic component and the cooling tube. This will ensure that the thermal resistance between the electronic component and the cooling tube can be reduced, and the amount of heat transfer grease that may be provided between the electronic component and the cooling tube can be reduced, too.

Furthermore, by regulating the pressure of the high-pressure fluid supplied to the high-pressure tube, it is possible to regulate a force or pressure applied from the high-pressure tube to the cooling tube in such a manner as to secure high cooling efficiency of the electronic component.

Moreover, since the high-pressure tube is disposed in contact with the cooling tube, the high-pressure fluid filled in the high-pressure tube constitutes a thermal resistance which is capable of preventing a temperature rise that may occur when the coolant flows along the cooling tube of the electronic component, due to the effect of heat emitted from another heat generating element (for example, another electronic component). By thus forming the thermal resistance, it is possible to suppress thermal interference between the electronic component and another electronic component forming a heat source.

It is appreciated that the cooling device according to the first aspect of the invention is able to prevent the thermal interference between the adjacent electronic components and also is easy to regulate the cooling efficiency of the electronic components.

Preferably, the cooling tube includes a first cooling tube adapted to be disposed in contact with one surface of the electronic component, and a second cooling tube adapted to be disposed in contact with the opposite surface of the electronic component. The first and second cooling tubes disposed on both surface of the electronic component achieve highly efficient cooling of the electronic component.

In one preferred form of the invention, the first and second cooling tubes disposed in contact with both surfaces of the electronic component are formed by part of a tube of U-shaped configuration having a pair stems and a bent portion interconnecting the stems at one end thereof. With this arrangement, since the first and second cooling tubes have an integral one-piece structure (as achieved by the U-shaped tube), the cooling device can be assembled easily and efficiently.

In another preferred form of the invention, the first and second cooling tubes disposed in contact with both surfaces of the electronic component are formed by part of a tube of ring-shaped configuration. The thus formed first and second cooling tubes have an integral one-piece structure (as achieved by the ring-shaped tube) and, hence, the cooling device can be assembled with utmost ease and increased efficiency. The cooling tubes formed as a part of the ring-shaped tube have an increased mechanical strength.

In one preferred form of the invention, the high-pressure tube includes a first high-pressure tube disposed in contact with the surface of the first cooling tube and a second high-pressure tube disposed in contact with the surface of the second cooling tube, the first and second high-pressure tubes being formed by part of a tube of U-shaped configuration having a pair of stems and a bent portion interconnecting the stems at one end thereof. Because both of the cooling tubes and the high-pressure tubes used in combination have an integral one-piece structure, the assembly efficiency of the cooling device is further increased.

In another preferred form of the invention, the high-pressure tube includes a first high-pressure tube disposed in contact with the surface of the first cooling tube and a second high-pressure tube disposed in contact with the surface of the second cooling tube, the first and second high-pressure tubes being formed by part of a tube of ring-shaped configuration. Since both of the cooling tubes and the high-pressure tubes used in combination have an integral one-piece structure, the assembly efficiency of the cooling device is further increased. Furthermore, the high-pressure tubes formed as a part of the ring-shaped tube have an increased mechanical strength.

Preferably, for use with a plurality of electronic components, the cooling tube of the cooling device includes a plurality of cooling tubes adapted to be disposed in contact with respective ones of the plurality of electronic components, and the high-pressure tube includes a plurality of high-pressure tubes disposed in contact with respective ones of the plurality cooling tubes, each of the high-pressure tubes being capable of accommodating a high-pressure fluid filled therein at a pressure different from a pressure of the high-pressure fluid filled in another high-pressure tube.

With this arrangement, the respective high-pressure tubes are so constructed as to accommodate high-pressure fluids of difference pressures, it is possible to adjust the force or pressure applied from each individual high-pressure tube to the associated cooling tube (and, hence, a force applied from each individual cooling tube to the associated electronic component) in such a manner that variations in the parallelism of the heat radiating surfaces between the respective electronic components or variations in the amount of warp of the heat radiating surfaces between the respective electronic components can be taken up or accommodated. This arrangement will further improve the cooling efficiency of the electronic components.

In the case where the electronic components have different heat values and hence create a large temperature difference between the adjacent electronic components, the pressure of the high-pressure fluid in the high-pressure tubes can be adjusted on a tube-by-tube basis so that the force or pressure acting from each individual cooling tube to the associated electronic component can be set in accordance with the heat values of the respective electronic components. By thus setting the pressure on the electronic components, it is possible to properly relieve a stress created due to thermal expansion of the electronic components.

Preferably, for use with a plurality of electronic components, the cooling tube of the cooling device includes a plurality of cooling tubes adapted to be disposed in contact with respective ones of the plurality of electronic components, and the high-pressure tube is inserted between each pair of adjacent cooling tubes of the plurality of cooling tubes that are disposed in contact with two adjacent electronic components of the plurality of electronic components. The thus arranged cooling device is able to prevent thermal interference between the adjacent electronic components and also is easy to adjust the cooling efficiency of the electronic components.

Alternatively, the high-pressure tube may be comprised of a single continuous high-pressure tube bent into a meandering configuration including a series of longitudinal high-pressure tube portions each disposed in contact with at least one of two adjacent cooling tubes of the plurality of cooling tubes.

Preferably, the cooling device further comprises pressure regulating means for regulating a supply pressure of the high-pressure fluid to be supplied to the high-pressure tube.

With the pressure regulating means thus provided, even after the cooling device is assembled into a power converter, the supply pressure of the high-pressure fluid can be adjusted in such a manner as to accommodate or take up variations in cooling efficiency caused due to the difference in parallelism or warpage of the heat radiating surfaces between the individual electronic components. By virtue of the regulation of the supply pressure of the high-pressure fluid, it is also possible to lower the level of various requirements for the heat release design. For example, the amount of heat transfer grease applied between the semiconductor modules (electronic components) and the cooling tubes in the assembly process of the power converter can be reduced, and a wider range of tolerance limits can be used for manufacturing accuracies including the parallelism and warpage of the heat radiating surfaces of the semiconductor modules (electronic components). Furthermore, if any one of the semiconductor modules (electronic components) undergoes undue thermal expansion during operation of the power converter, a force or pressure acting between the thermally expanded semiconductor module (electronic component) and the associated cooling tubes can be adjusted to take up the thermal expansion of the semiconductor module (electronic component).

Preferably, the high-pressure fluid is compressed air as it can provide a thermal resistance large enough to prevent thermal interference between the electronic components. The high-pressure fluid may include gases other than air, and a liquid such as oil or water.

According to a second aspect of the present invention, there is provided a cooling device for an electronic component, comprising: a cooling tube adapted to be disposed in contact with the electronic component and having an internal coolant flow channel for the passage therethrough of a cooling medium; and a presser tube disposed adjacent to a surface of the cooling tube that faces away from the electronic component. The presser tube has a hollow interior filled with a thermowax that expands and contracts according to the temperature of the cooling medium. The presser tube is capable of expanding and contracting in a laminating direction perpendicular to the surface of the cooling tube whereby the expansion and contraction of the thermowax causes the presser tube to expand and contract in the laminating direction.

The thus arranged cooling device utilizes the expansion of the thermowax within the presser tube for urging the cooling tubes against the electronic component. More specifically, when the temperature of the electronic component rises to thereby increase the temperature of the cooling medium circulating through the cooling tube, the thermowax shielded within the presser tube disposed adjacent to the cooling tube is heated. When the thermowax is heated, it expands causing the presser tube to expand in a width direction (laminating direction) thereof. With this expansion of the presser tube, a force or pressure is exerted from the presser tube onto the cooling tube in a direction to urge the cooling tube against the electronic component. The thus urged cooling tube is able to sufficiently follow or fit the surface configuration of a heat radiating surface of the electronic component with the result that the thermal resistance between the cooling tube and the electronic component is reduced and the cooling efficiency of the cooling device is increased. By the use of the thermowax, it is possible to increase the cooling efficiency in conjunction with cooling needs, which increase as the temperature of the electronic component increases.

Furthermore, even when the parallelism of the opposite heat radiating surfaces of the electronic component is relatively low or either heat radiating surface has a warp, the associated cooling tube is able to follow the surface configurations of the heat radiating surfaces to thereby take up or minimize a clearance between the electronic component and the cooling tube.

Additionally, since the presser tube and the cooling tube are in contact with each other, the thermowax filled in the presser tube forms a thermal resistance, which is large enough to isolate the cooling medium circulating through the cooling tube from the effect of heat emitted from another heat source (electronic component). By thus forming the thermal resistance, it is possible to efficiently block thermal interference between the adjacent electronic components.

Preferably, the presser tube has a buffer section for temporarily accommodating therein part of the thermowax when the thermowax is unduly expanded by the heat from the cooling medium, and the buffer section has a return mechanism for returning the thermowax from the buffer section to the hollow interior of the presser tube when the thermowax held within the presser tube contracts.

By virtue of the buffer section, the presser tube is kept free from rupturing even when the thermowax undergoes undue expansion due to, for example, overheating of the electronic component. Furthermore, thanks to the return mechanism associated with the buffer section, that part of the thermowax, which has been accommodated in the buffer section and hence has flowability inferior to that of a major part of the thermowax held within the presser tube, can be smoothly returned from the buffer section to the presser tube in immediate response to the occurrence of the next contraction of the major part of the thermowax.

Preferably, the presser tube has a diaphragm portion deformable to facilitate the expansion and contraction of the presser tube in the laminating direction (widthwise direction of the presser tube). By the expansion and contraction of the thermowax, the diaphragm portion undergoes deformation to thereby facilitate the widthwise expansion and contraction of the presser tube.

According to a third aspect of the present invention, there is provided a cooling device for cooling an electronic component, comprising: a cooling tube adapted to be disposed in contact with the electronic component and having an internal coolant flow channel for the passage therethrough of a cooling medium; and a presser member disposed adjacent to a surface of the cooling tube that faces away from the electronic component, the presser member being formed from a shape memory alloy having a spring characteristic which expands and contracts according to the temperature of the cooling medium.

By virtue of the presser member formed from a shape memory alloy and having a spring characteristic that expands and contracts according to the temperature of the cooling medium circulating through the cooling tube, the expansion of the presser member urges the cooling tube against the electronic component. More specifically, when the temperature of the electronic component rises to thereby increase the temperature of the cooling medium circulating through the cooling tube, the presser member of shape memory alloy disposed adjacent to the cooling tubes is heated. When heated, the presser member expands in a widthwise direction (laminating direction). With this expansion of the presser member, a force or pressure acts from the presser member onto the cooling tube in a direction to urge the cooling tube against the electronic component. The thus urged cooling tube is able to sufficiently follow or fit the surface configuration of a heat radiating surface of the electronic component with the result that the thermal resistance between the cooling tube and the electronic component is reduced and the cooling efficiency of the cooling device is increased. By the use of the presser member of shape memory alloy, it is possible to increase the cooling efficiency in conjunction with cooling needs, which increase as the temperature of the electronic component increases.

Even when the parallelism of both heat radiating surfaces of the electronic component is relatively low or either heat radiating surface has a warp, the cooling tube is able to follow the surface configuration of the mating heat radiating surface to thereby take up or minimize a clearance between the electronic component and the cooling tube.

Furthermore, since the presser member and the cooling tube are in contact with each other, and since the presser member has a tubular shape having a hollow interior space, the hollow interior space provides a thermal resistance which is large enough to prevent a temperature rise that may occur due to the effect of heat emitted from another heat source (electronic component) onto the heat medium circulating through the cooling tube. By thus providing the thermal resistance, it is possible to suppress thermal interference between the adjacent electronic components.

According to a fourth aspect of the present invention, there is provided an electric power conversion device comprised of a plurality of semiconductor modules each having a semiconductor device incorporated therein, and the cooling device according to any one of the first to third aspects of the invention as means for cooling the semiconductor modules.

The high-pressure tube and the presser tube are preferably press-formed from a sheet metal of aluminum alloy and shielded by brazing to provide a hermetically shielded hollow interior space. The high-pressure tube and the presser tube are configured to undergo elastic deformation to expand at an interface relative to the cooling tube when subjected to the force or pressure applied from the high-pressure fluid or the thermowax filled within the tube. The electronic component may include a semiconductor module having semiconductor devices packaged or incorporated therein to form a structural component of an electric power conversion device (power converter). The cooling device of the invention may be used in combination with various other electronic components such as reactor.

DETAILED DESCRIPTION OF THE PREFERRED EMBODIMENTS

First Embodiment

Figure 1:
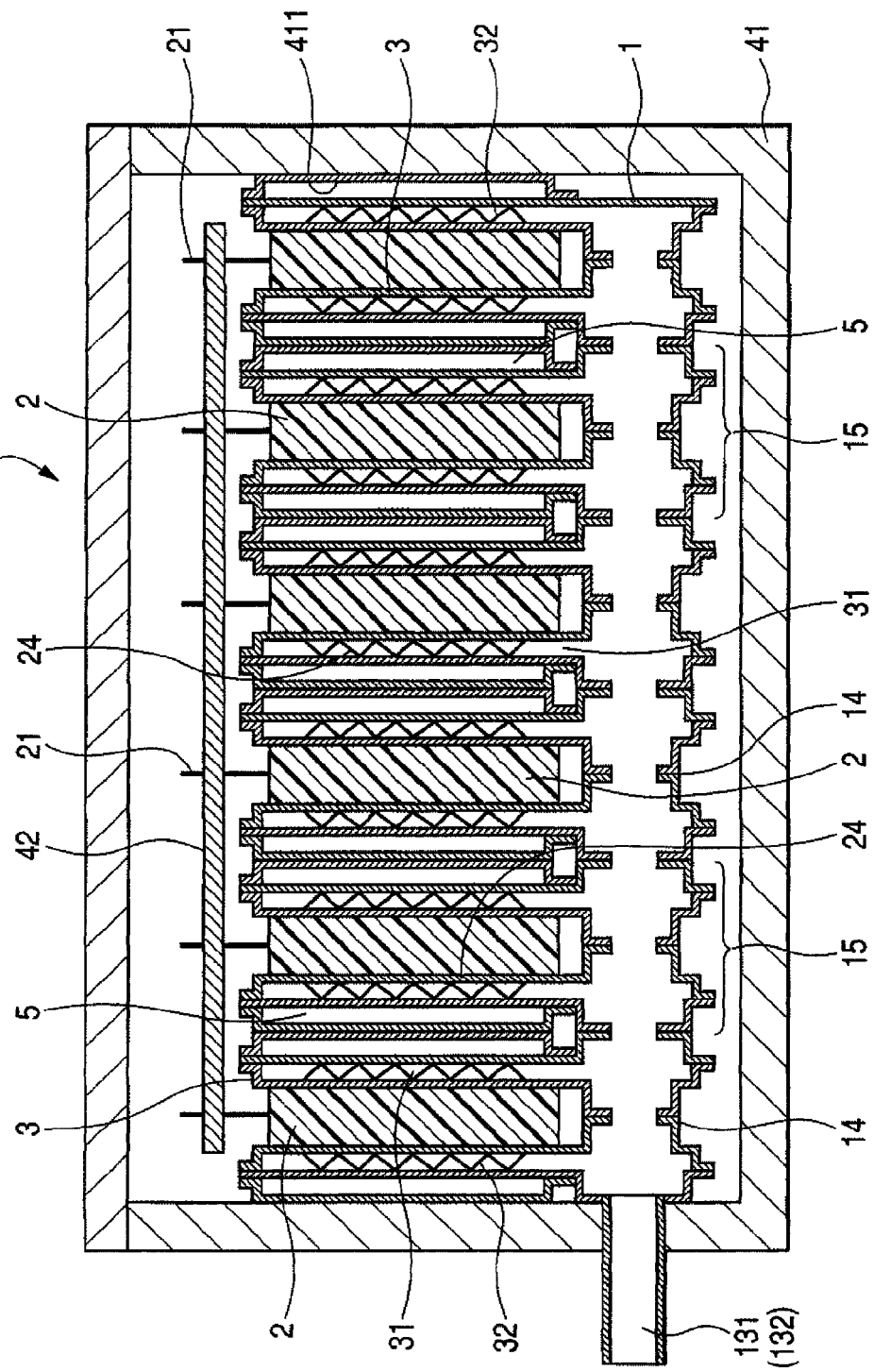
FIG. 1 is a cross-sectional view of a cooling device for an electronic component and an electric power conversion device or converter equipped with the cooling device according to a first embodiment of the present invention.

Referring now to the drawings, wherein like reference characters designate like or corresponding parts throughout the several views, FIG. 1 shows a cooling device for an electronic component and an electric power converting device or converter equipped with the cooling device according to a first embodiment of the present invention.

In this embodiment, the cooling device 1 takes the form of a cooling device so configured as to cool semiconductor modules as electronic components. The cooling device 1 comprises a cooling tube 3 disposed in contact with each of the semiconductor modules 2 and having an internal coolant flow channel 31 for the passage therethrough of a cooling medium or coolant, and a high-pressure tube 5 disposed adjacent to a surface of the cooling tube 3 that faces away from the associated semiconductor module 2. The high-pressure tube 5 has a hollow interior that can be filled with a high-pressure fluid.

The cooling tube 3 is disposed in contact with both surfaces of each of the semiconductor modules 2. It may be said that the cooling tube 3 is composed of a first cooling tube 3 disposed in contact with one surface of each semiconductor module 2, and a second cooling tube 3 disposed in contact with the opposite surface of the same semiconductor module 2. The first and second cooling tubes 3 and 3 are provided in one pair.

Thus, the cooling device 1 includes a plurality (six in the illustrated embodiment) of pairs of cooling tubes 3 disposed in contact with both surfaces of the respective ones of the semiconductor modules 2, and a plurality (six in the illustrated embodiment) of pairs of high-pressure tubes 5 disposed adjacent to one surface of the respective pairs of the cooling tubes 3 that faces away from the semiconductor modules 2. The cooling tubes 3 and the high-pressure tubes 5 are constructed to allow the passage of high-pressure fluids of different pressures.

The electric power conversion device or converter 4 (hereinafter referred to as "power converter") is equipped with a plurality (six in the illustrated embodiment) of semiconductor modules 2 each having semiconductor devices, such as IGBTs (Insulated Gate Bipolar Transistors), incorporated therein, and a cooling means constituted by the aforesaid cooling device 1 for cooling the semiconductor modules 2. Each of the semiconductor modules 2, one pair of cooling tubes 3, 3 associated with the semiconductor module 2, and one pair of high-pressure tubes 5, 5 associated with the pair of cooling tubes 3, 3 together form a semiconductor cooling unit 15. Six such semiconductor cooling units 15 are laminated together such that two adjacent ones of the high-pressure tubes 3 of each pair of adjacent semiconductor cooling units 15 are in face-to-face contact with each other.

The cooling device 1 has a connecting portion 14 formed at one end of the cooling tubes 3 so as to communicate together the coolant flow channels 31 of the cooling tubes 3 of the adjacent semiconductor cooling units 15. The endmost cooling tube 3 (left-side end in FIG. 1) is provided with a coolant inlet pipe 131 for introducing the coolant into the cooling device 1, and a coolant outlet pipe 132 for discharging the coolant from the cooling device 1. Each of the cooling tubes 3 has a corrugated fin 32 disposed inside the coolant flow channel 31.

The cooling tubes 3 and the high-pressure tubes 5 are formed from press-formed aluminum plates joined together by brazing into a desired configuration.

The coolant used for circulation through the coolant flow channels 31 may include a natural cooling medium such as water or ammonia, water mixed with an ethylene glycol antifreeze liquid, a fluorochemical refrigerant such as Fluorinert ("Fluorinert" is the trademark for fluorine inert fluid), a fluorocarbon refrigerant such as HCFC-123 or HFC-134a, an alcohol coolant such as methanol or alcohol, and a ketone coolant such as acetone. The high-pressure fluid may include compressed air.

The coolant, as it flows through the coolant flow channels 31 of the cooling tubes 3, undergoes a heat exchange operation relative to the semiconductor modules 2 and thereby cools the semiconductor modules 2 via the cooling tubes 3 that are held in contact with the semiconductor modules 2 under the force or pressure applied from the high-pressure tubes 5. Stated more specifically, when the high-pressure fluid (compressed air) is introduced into the high-pressure tubes 5, the high-pressure tubes 5 undergo radial expansion and force the adjacent cooling tubes 3 toward the associated semiconductor modules 2, thereby increasing the degree of adhesion between the cooling tubes 3 and the semiconductor modules 2. This will reduce the thermal resistance between the semiconductor modules 2 and the cooling tubes 3 and increase the efficiency of the heat exchange operation.

Each of the semiconductor modules 2 has electrode terminals (not shown) for input and output of a controlled current, and a control terminal 21 connected to a control circuit board 42 that is provided for controlling the semiconductor modules 2.

The power converter 5 has a case 41 in which structural components of the power converter 5 is contained. Endmost high-pressure tubes 5 that are located at opposite ends in a laminating direction of the high-pressure tubes 5 are held in contact with inside surfaces 411 of the case 41. The coolant inlet pipe 131 and the coolant outlet pipe 132 are projected outward from the case 41. In the manufacturing process of the power converter 4, the high-pressure fluid is supplied at a predetermined pressure into the high-pressure tubes 5. With the high-pressure tubes 5 being filled with the high-pressure fluid of predetermined pressure, inlet and outlet ports (not shown) of the high-pressure tubes 5 are sealed.

Various advantageous effects that can be attained by the first embodiment of the present invention are as follows:

In the cooling device 1 of the first embodiment, the cooling tubes 3 are forced against the semiconductor modules 2 by the pressure of the high-pressure fluid 5 supplied in the high-pressure tubes 5. More particularly, by virtue of the radial expansion of the high-pressure tubes 5 while being filled with the high-pressure fluid, a force or pressure is exerted from the high-pressure tubes 5 onto the cooling tubes 3 in a direction to urge the cooling tubes 3 toward the semiconductor modules 2. The thus urged cooling tubes 3 are able to sufficiently follow or fit the configurations of heat radiating surfaces 24 of the semiconductor modules 2 with the result that the thermal resistance between the cooling tubes 3 and the semiconductor modules 2 is reduced and the cooling efficiency of the cooling device 1 is increased.

Even when the parallelism of the opposite heat radiating surfaces 24 of any one of the semiconductor modules 2 is relatively low or either heat radiating surface 24 has a warp, the associated cooling tubes 3 are able to follow the surface configurations of the heat radiating surfaces 24 to thereby take up or minimize a clearance between the semiconductor module 2 and the cooling tubes 3. This will ensure that the thermal resistance between the semiconductor modules 2 and the cooling tubes 3 can be reduced, and the amount of heat transfer grease that may be provided between the semiconductor modules 2 and the cooling tubes 3 can be reduced, too.

Furthermore, since the high-pressure tubes 5 are disposed in contact with the cooling tubes 3, the high-pressure fluid filled in the high-pressure tubes 5 forms a thermal resistance which is large enough to prevent a temperature rise from occurring in the coolant circulating through the cooling tubes 3 associated with one semiconductor module 3 due to the effect of heat emitted from another semiconductor module 2. Thus, these two semiconductor modules 2 are thermally isolated by the thermal resistance formed by the high-pressure fluid. By thus forming the thermal resistance, it is possible to suppress thermal interference between the adjacent semiconductor modules 2.

The respective high-pressure tubes 5 are so constructed as to accommodate high-pressure fluids of difference pressures. Since the forces or pressures applied from the respective ones of the high-pressure tube 5 to the associated cooling tubes 3 (and, hence, forces applied from the respective ones of the cooling tube 3 to the associated semiconductor modules 2) can be adjusted independently from one another, variations in the parallelism of the heat radiating surfaces 24 between the semiconductor elements or variations in the amount of warp of the heat radiating surfaces 24 between the semiconductor modules 2 can be taken up or accommodated. This arrangement will further improve the cooling efficiency of the semiconductor modules 2.

In the case where the semiconductor modules 2 have different heat values and hence create a large temperature difference between the adjacent semiconductor modules, the pressure of the high-pressure fluid in the high-pressure tubes 5 can be adjusted on a tube-by-tube basis so that the force or pressure acting from each individual cooling tube 3 to the associated semiconductor module 2 can be set in accordance with the heat value of a corresponding one of the semiconductor modules 2. By thus setting the pressures on the semiconductor modules 2, it is possible to properly relieve a stress created due to thermal expansion of the semiconductor modules 2.

Furthermore, the amount of positional displacement of the semiconductor modules 2 occurring when the cooling tubes 4 are independently urged against the associated semiconductor modules 2 is small as compared to the conventional arrangement in which a single block of alternate semiconductor modules and cooling tubes is compressed in a laminating direction. Accordingly, the amount of positional displacement of the control terminals 21 is also small, which will give no adverse effect on the structure and function of a connection or joint between each individual semiconductor module 2 and the control circuit board 42.

The compressed air used as a high-pressure fluid introduced in the high-pressure tubes 5 provides the high-pressure tubes 5 with a high thermal resistance, which is effective to prevent thermal interference between the adjacent semiconductor modules 2.

As appears clear from the foregoing description, according to the first embodiment of the present invention, there is provided a cooling device 1 and a power converter 4 that are capable of preventing thermal interference between the adjacent semiconductor modules 2 and also are easy to regulate the cooling efficiency of the semiconductor modules 2.

Second Embodiment

Figure 2:
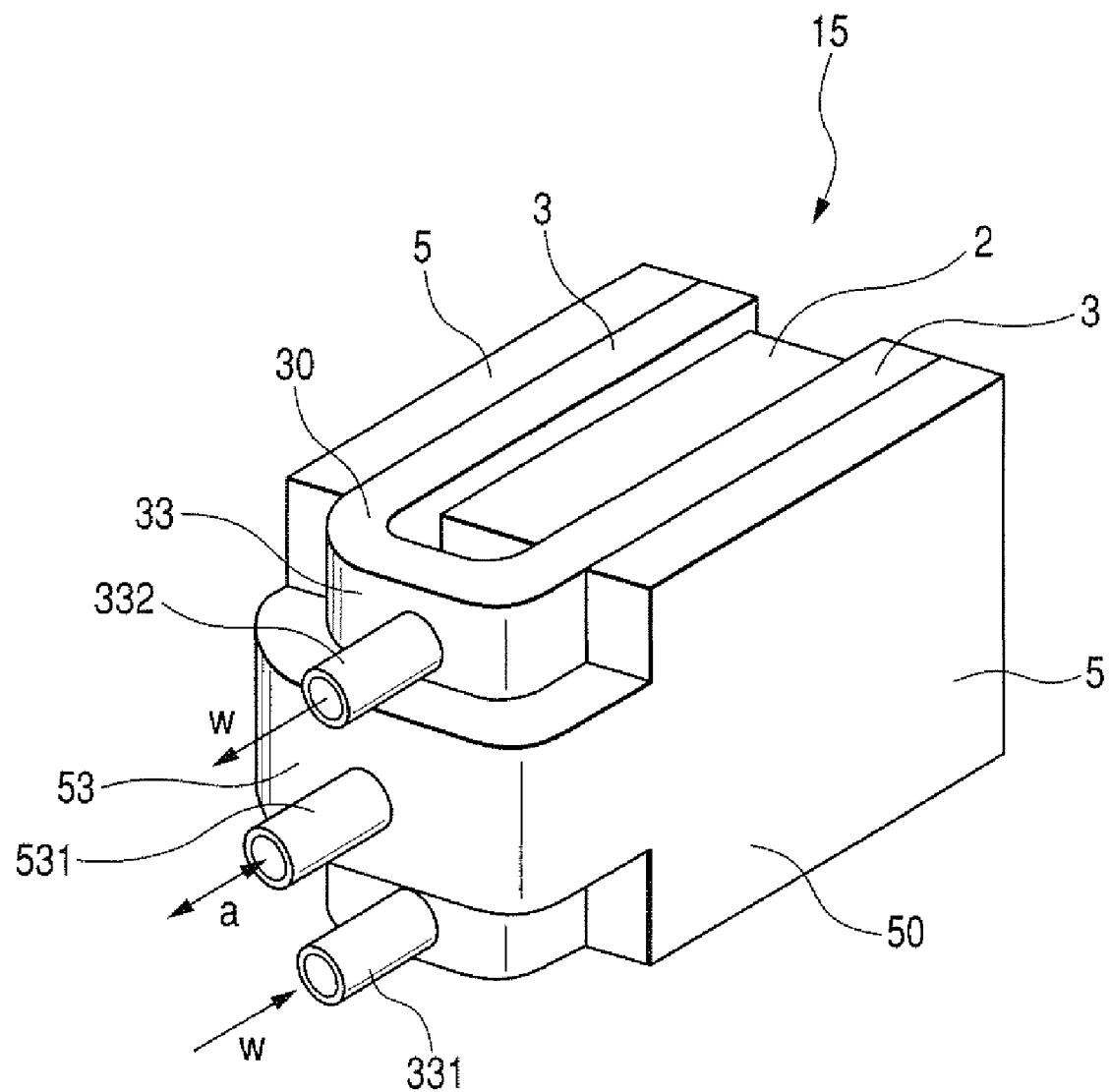
FIG. 2 is a perspective view showing a semiconductor cooling unit according to a second embodiment of the present invention.
Figure 3:
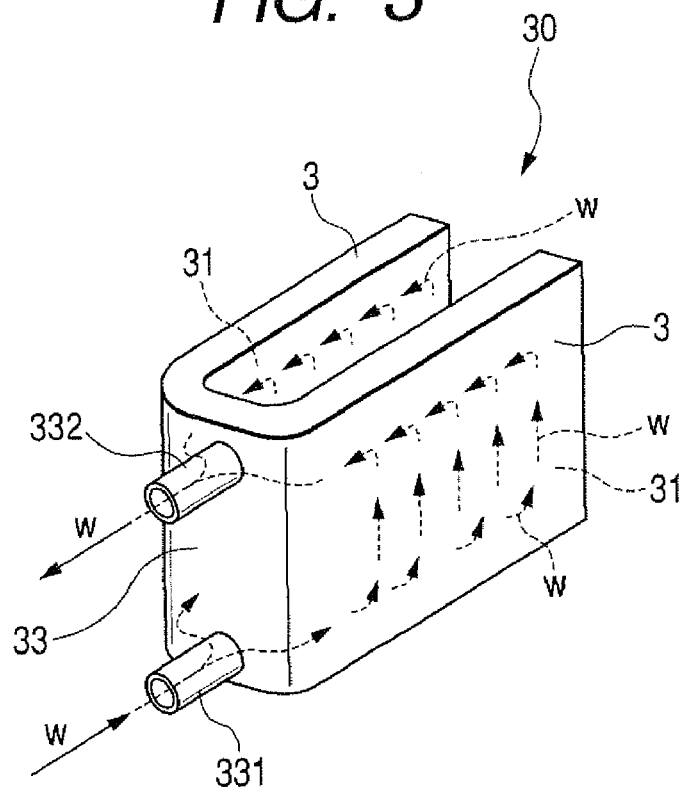
FIG. 3 is a perspective view of a pair of cooling tubes of the semiconductor cooling unit according to the second embodiment of the present invention.
Figure 4:
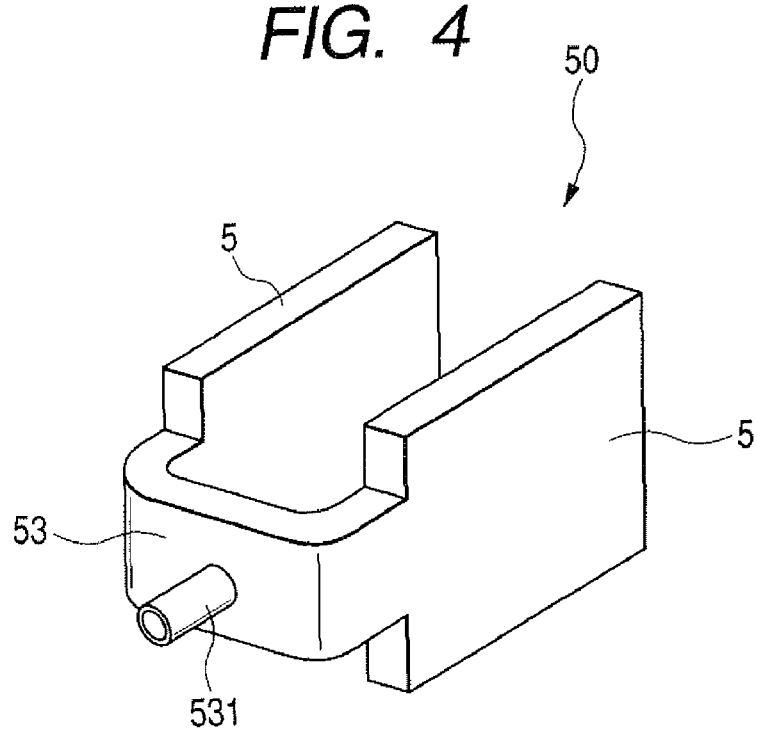
FIG. 4 is a perspective view of a pair of high-pressure tubes of the semiconductor cooling unit according to the second embodiment of the invention.

A second embodiment of the invention will be described below with reference to FIGS. 2 to 5. As shown in FIGS. 2 and 3, a pair of cooling tubes 3 and 3 is in contact with both surfaces (heat radiating surfaces) of a semiconductor module 2. The cooling tubes 3 are formed by part of a tube 30 of U-shaped configuration having a pair of straight stems and a bent portion 33 interconnecting the straight stems at one end thereof. More particularly, the cooling tubes 3, 3 are formed by the straight stems of the U-shaped tube 30. Similarly, as shown in FIGS. 2 and 4, a pair of high-pressure tubes 5 and 5 is in contact with the pair of cooling tubes 3, 3, respectively. The high-pressure tubes 5, 5 are formed by part of a tube 50 of U-shaped configuration having a pair of straight stems and a bent portion 53 interconnecting the straight stems at one end thereof. More particularly, the high-pressure tubes 5, 5 are formed by the straight stems of the U-shaped tube 50.

As shown in FIGS. 2 and 3, the U-shaped tube 30 forming the pair of cooling tubes 3 and 3 has a coolant inlet portion 331 and a coolant outlet portion 332 both provided at the bent portion 33. With this arrangement, a cooling medium or coolant W introduced from the coolant inlet portion 331 into the U-shaped tube 30 is branched into two coolant flow channels 31, 31 (FIG. 3) formed in the respective cooling tubes 5, 5. Branched flows of the coolant E circulate through the respective coolant flow channels 31, 31 and merge together at the coolant outlet portion 332 from which the coolant E in the U-shaped tube 30 is finally discharged.

Similarly, as shown in FIGS. 2 and 4, the U-shaped tube 50 forming the pair of high-pressure tubes 5 and 5 has a high-pressure fluid inlet/outlet portion 531 provided at the bent portion 53. With this arrangement, a high-pressure fluid "a" can be introduced from the high-pressure fluid inlet/outlet portion 531 into hollow interiors of the respective high-pressure tubes 5, 5. As a shielding means for shielding the high-pressure fluid inside the high-pressure tubes 5, 5, a check valve (not shown) is provided in the high-pressure fluid inlet/outlet portion 531. Alternatively, the high-pressure fluid inlet/outlet portion 531 may be closed by caulking after it is completely filled with the high-pressure fluid supplied at a predetermined pressure.

As shown in FIG. 2, the U-shaped tube 30 forming the pair of cooling tubes 3 and 3 is received inside the U-shaped tube 50 forming the pair of high-pressure tubes 5 and 5 with the respective bent portions 33, 55 overlapping each other. In this instance, the bent portion 53 of the U-shaped tube 50 is narrowed or reduced in width so as to avoid interference with the coolant inlet and outlet portions 331 and 332 provided at the bent portion 33 of the U-shaped tube 30.

Figure 5:
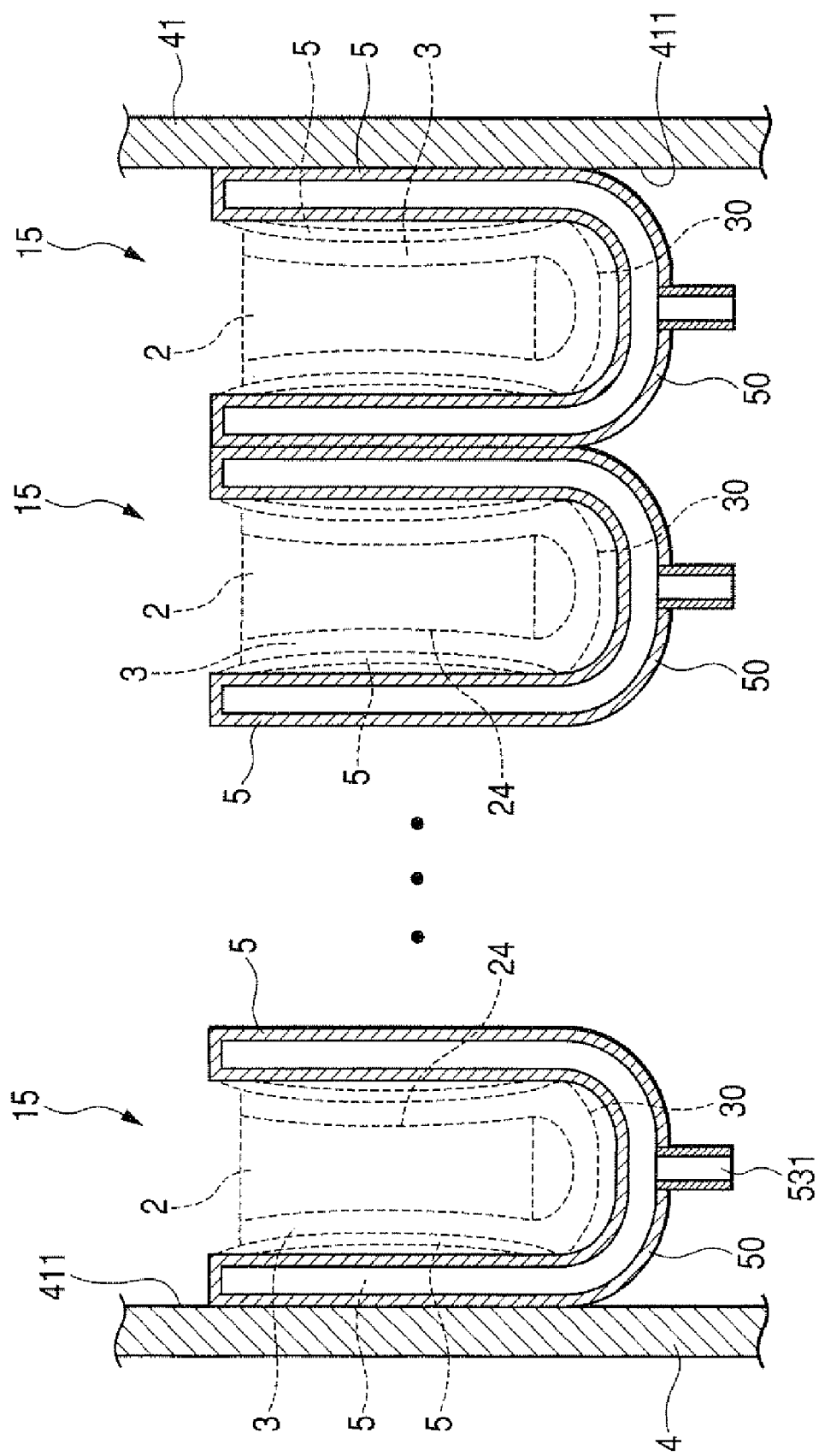
FIG. 5 is a cross-sectional view illustrative of the manner in which a plurality of semiconductor cooling units are arranged into a laminated structure inside a case according to the second embodiment of the present invention.

The semiconductor module 2, the U-shaped tube 30 including the pair of cooling tubes 3 and 3, and the U-shaped tube 5 including the pair of high-pressure tubes 5 and 5 jointly form a semiconductor cooling unit 15. As shown in FIG. 5, plural such semiconductor cooling units 15 are arranged into a laminated structure and received inside the case 41 such that when the high-pressure fluid "a" (FIG. 2) is introduced into the high pressure tubes 5 of each individual semiconductor cooling unit 15, the high-pressure tubes 5 expand toward the cooling tubes 3 and force the cooling tubes 3 toward the associated semiconductor module 2 in the manner as indicated by the broken lines shown in FIG. 5.

The coolant inlet portion 331 and the coolant outlet portion 332 provided at the bent portion 33 of each U-shaped tube 30 are connected to a coolant supply header (not shown) and a coolant discharge header (not shown), respectively. The coolant supply header and the coolant discharge header are connected to the coolant inlet pipe 131 (FIG. 1) and the coolant outlet pipe 132 (FIG. 1), respectively, of the cooling device 1.

Other parts of the second embodiment are the same as those described above with respect to the first embodiment and further description thereof can be omitted.

According to the second embodiment, because a pair of cooling tubes 3 and 3 and a pair of high-pressure tubes 5 and 5 have an integral one-piece structure (as achieved by the U-shaped tubes 30 and 50), the cooling device 1 can be assembled with high efficiency. The cooling device according to the second embodiment is also able to achieve the same advantageous effects as those attained by the cooling device of the first embodiment.

Third Embodiment

Figure 6:
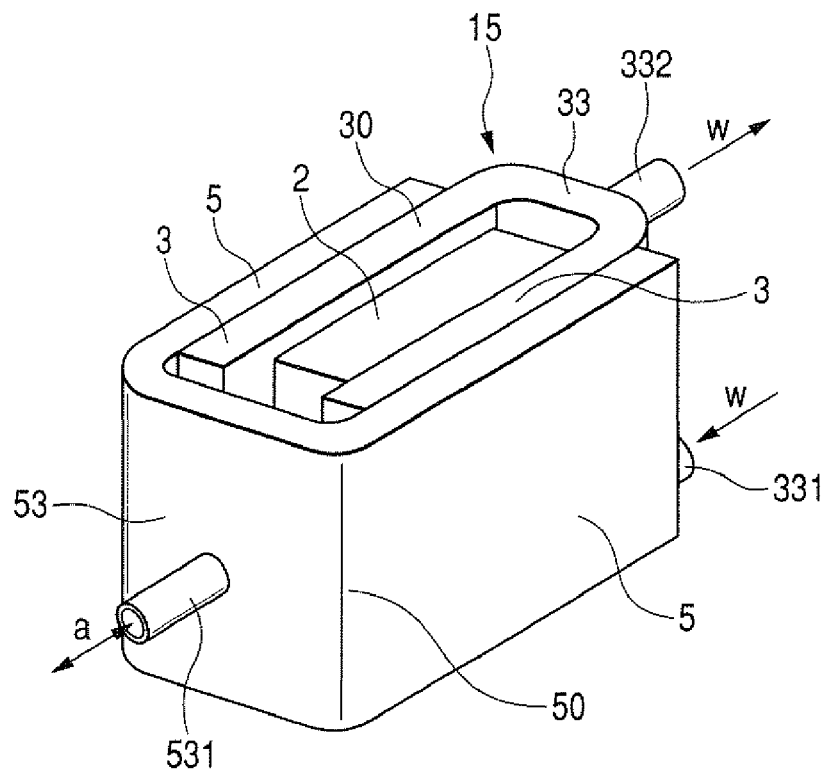
FIG. 6 is a perspective view showing a semiconductor cooling unit according to a third embodiment of the present invention.

FIG. 6 shows a semiconductor cooling unit 15 according to a third embodiment of the present invention. The semiconductor cooling unit 15 of this embodiment is substantially the same in construction as the semiconductor cooling unit of the second embodiment shown in FIG. 2 with the exception that the U-shaped tube 30 forming a pair of cooling tubes 3 and 3 is received or nested in the U-shaped tube 30 forming a pair of high-pressure tubes 5 and 5 with the respective bent portions 33, 55 disposed on opposite sides of the semiconductor module 2.

With this arrangement, the bent portion 53 of the U-shaped tube 50 does not interfere with the coolant inlet and outlet portions 331, 332 and hence this bent portion 53 is not narrowed in width but has the same width as the bent portion 33 of the U-shaped tube 30.

Other parts of the third embodiment are the same as those described above with respect to the second embodiment and further description thereof can be omitted. Due to the structural similarity, the semiconductor cooling unit 15 of the third embodiment is able to achieve the same advantageous effects as those attained by the semiconductor cooling unit of the second embodiment.

Fourth Embodiment

Figure 7:
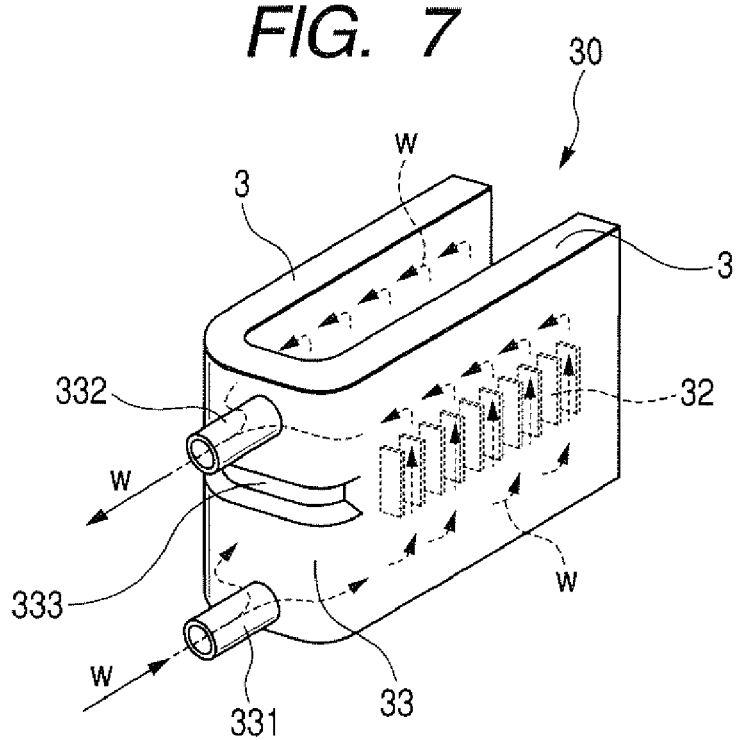
FIG. 7 is a perspective view of a pair of cooling tubes according to a fourth embodiment of the present invention.
Figure 8:
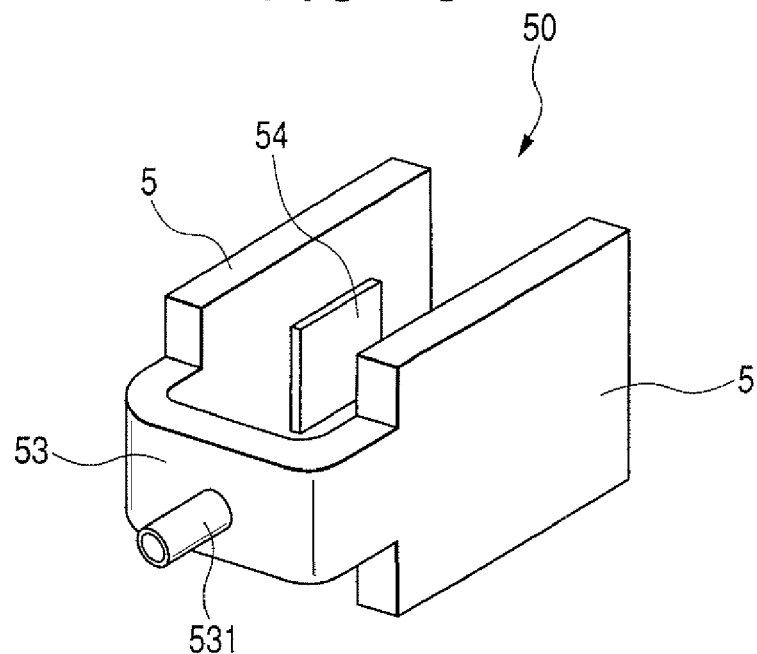
FIG. 8 is a perspective view of a pair of high-pressure tubes according to the fourth embodiment of the present invention.
Figure 9:
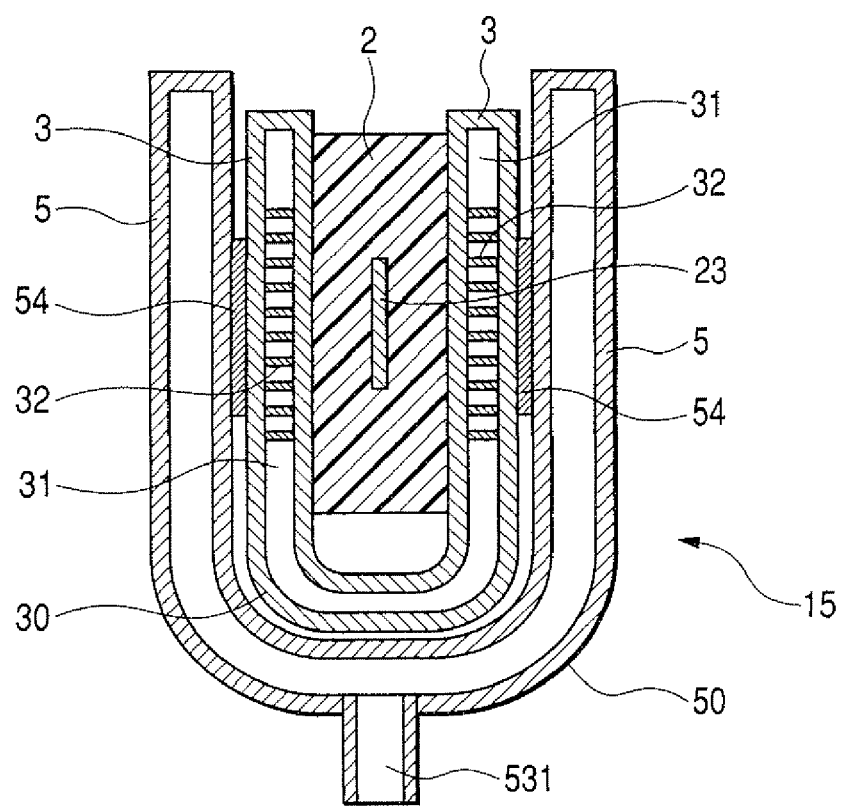
FIG. 9 is a perspective view of a semiconductor cooling unit according to the fourth embodiment of the present invention.

A fourth embodiment of the present invention will be described below with reference to FIGS. 7 to 9. As shown in FIGS. 7-9, this embodiment is arranged such that each of the cooling tubes 3 and 3 of a U-shaped tube 30 has a series of fins 32 disposed in the coolant flow channel 31, and each of the high-pressure tubes 50 of a U-shaped tube 50 has a protrusion 30 on a surface facing the associated cooling tube 3. The protrusion 30 has a flat top surface.

The bent portion 33 of the U-shaped tube 30 is recessed to form a partition 333 that blocks direct fluid communication between the coolant inlet portion 331 and the coolant outlet portion 332 before the coolant W completes circulation through the respective coolant flow channels 41 (FIG. 9) of the cooling tubes 3, 3.

With this arrangement, the coolant W introduced from the coolant inlet portion 331 into the U-shaped tube 30 is branched into the pair of cooling tubes 3, 3. Branched flows of the coolant W then circulate through the respective coolant flow channels 41 (FIG. 9) of the cooling tubes 3, 3 while passing along the fins 32 with uniform distribution over the entire area of the coolant flow channels 41. The coolant W is finally discharged from the coolant outlet portion 332.

In this instance, since the fins 32 are provided at a position substantially corresponding to the position of a semiconductor device 23 (FIG. 9) incorporated in the semiconductor module 2, the heat exchange between the coolant W and the semiconductor device 23 as a heat source occurs intensively at that portion of the cooling tubes 3 including the fins 32 and the efficiency of such intensive heat exchange operation is very high.

Furthermore, since the protrusion 54 on each of the high-pressure tubes 5 is provided at a position substantially corresponding to the position of the semiconductor device 23 incorporated in the semiconductor module 2, the force or pressure applied from the high-pressure tube 5 to the associated cooling tube 3 acts intensively onto that portion of the semiconductor module 2 including the semiconductor device 23. This will provide a higher degree of adhesion between the cooling tube 3 and the semiconductor module portion including the semiconductor device 23, leading to an enhanced cooling efficiency of that portion of the semiconductor module 2 including the semiconductor device 23.

Other parts of the fourth embodiment are the same in construction, operation and effect achieved as those attained by the second embodiment and no further description thereof is needed.

In place of the protrusion 54, each of the high-pressure tubes 5 may have a highly deformable portion which is likely to undergo elastic deformation when subjected to the pressure of the high-pressure fluid. As an alternative, the semiconductor module 2 may have a protrusion or an outward warp on a surface area corresponding in position to that portion of the high-pressure tube 5 including the protrusion 54.

Fifth Embodiment

Figure 10:
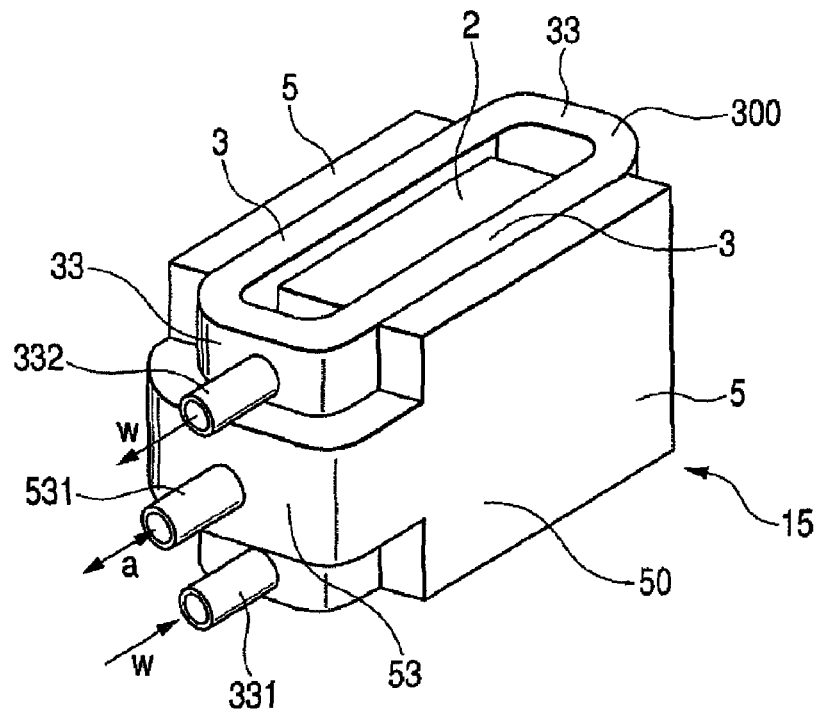
FIG. 10 is a perspective view showing a semiconductor cooling unit according to a fifth embodiment of the present invention.

FIG. 10 shows a semiconductor cooling unit 15 according to a fifth embodiment of the present invention. The semiconductor cooling unit 15 of this embodiment differs from the semiconductor cooling unit of the second embodiment shown in FIG. 2 in that the pair of cooling tubes 3, 3 disposed in contact with both surfaces (heat radiating surfaces) of the semiconductor module 2 are formed by part of a tube 300 of ring-shaped configuration including a pair of parallel spaced straight portions and a pair of opposed bent portions 33, 33 each connecting one end of the straight portions.

With this arrangement, since the pair of cooling tubes 3 and 3 has an integral one-piece structure (as achieved by the ring-shaped tube 300), the semiconductor cooling unit 15 can be assembled with increased efficiency. The cooling tubes 3 formed as a part of the ring-shaped tube 300 have an increased mechanical strength.

Other parts of the fifth embodiment are the same in construction, function and effect achieved as those parts of the second embodiment and no further description thereof is needed.

Sixth Embodiment

Figure 11:
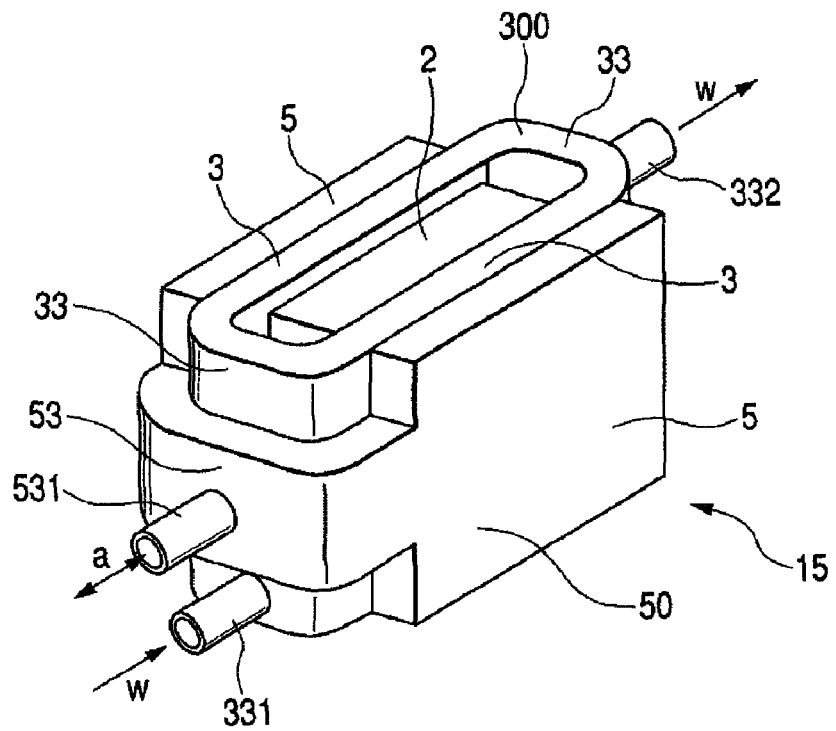
FIG. 11 is a perspective view of a semiconductor cooling unit according to a sixth embodiment of the present invention.

FIG. 11 shows a semiconductor cooling unit 15 according to a sixth embodiment of the present invention. The semiconductor cooling unit 15 of this embodiment is a modification of the semiconductor cooling unit of the fifth embodiment shown in FIG. 10. As shown in FIG. 11, the coolant inlet portion 331 is provided at one bent portion 33 of the ring-shaped tube 300, and the coolant outlet portion 332 is provided at the other bent portion 33 of the ring-shaped tube 300. The coolant inlet portion 331 and the coolant outlet portion 332 are disposed at portions of the ring-shaped tube 300 that are diagonally opposite to each other with respect to a central axis of the ring-shaped tube 300.

Other parts of the sixth embodiment are the same in construction, function and effect achieved as those parts of the fifth embodiment and further description thereof can be omitted.

In the fifth and sixth embodiments described above, the pair of high-pressure tubes 5 and 5 disposed in contact with outer surfaces of the cooling tubes 3, 3 may be formed by part of a tube of ring-shaped configuration.

Seventh Embodiment

Figure 12:
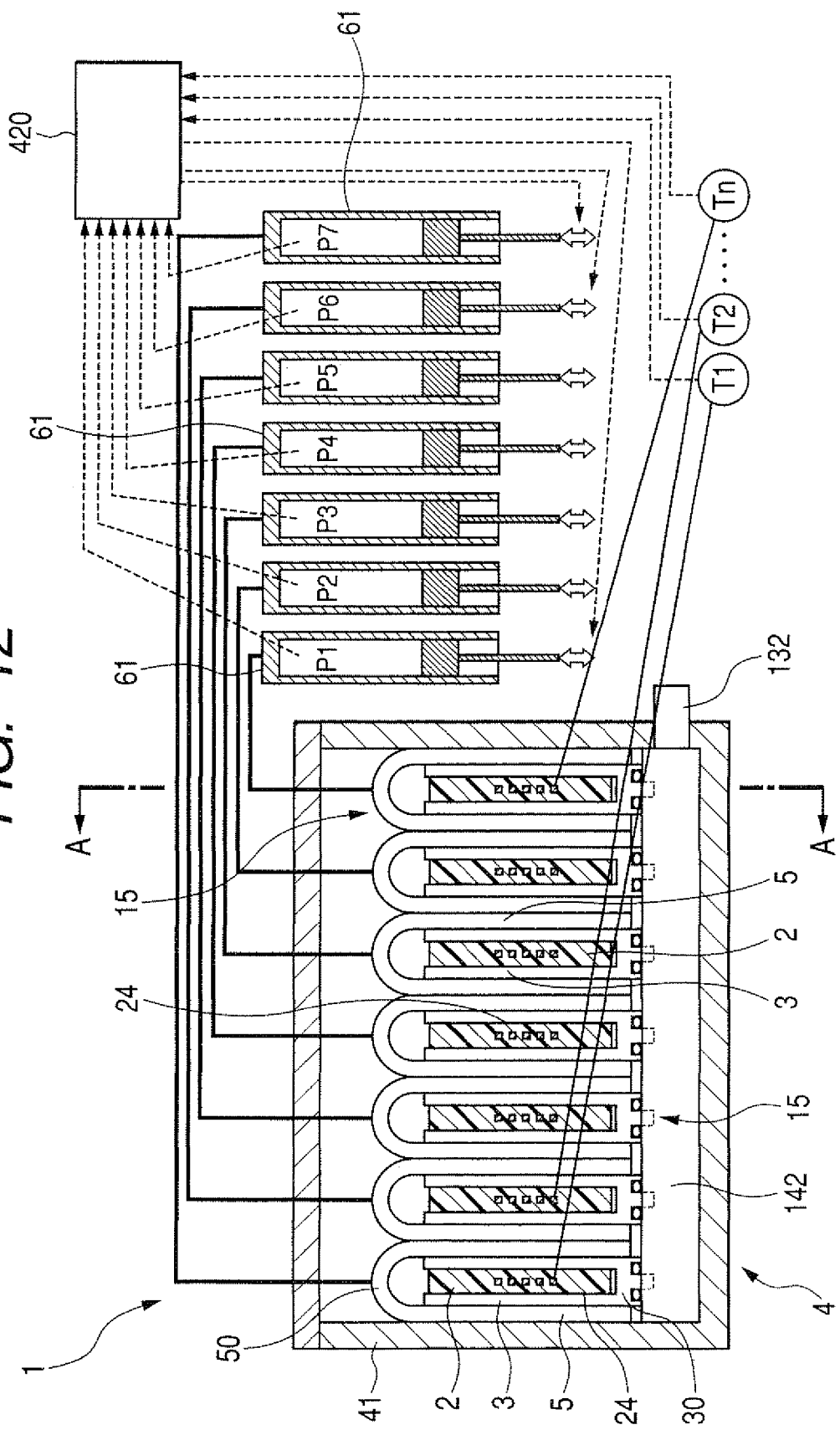
FIG. 12 is a diagrammatic cross-sectional view of a power converter according to a seventh embodiment of the present invention.
Figure 13:
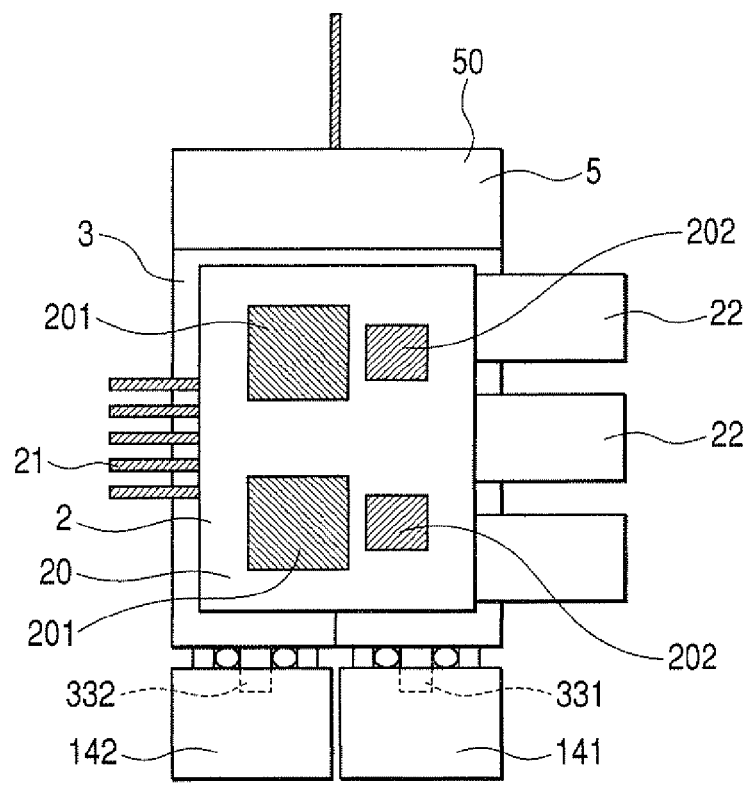
FIG. 13 is a cross-sectional view taken along line A-A of FIG. 12.
Figure 14:
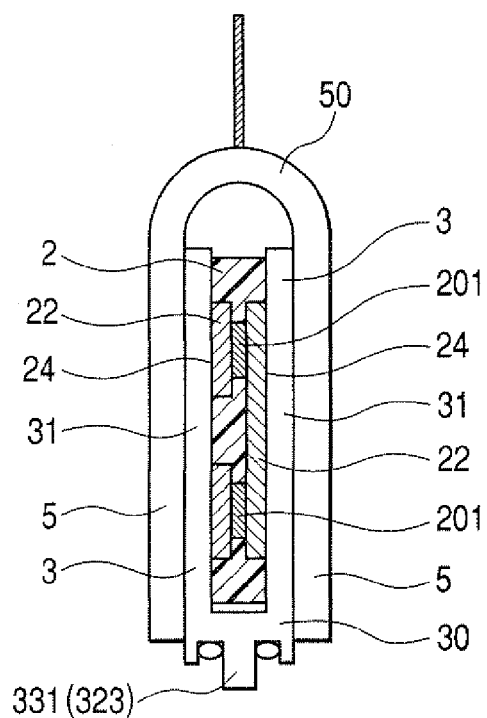
FIG. 14 is a diagrammatic cross-sectional view showing a semiconductor cooling unit according to the seventh embodiment of the present invention.

FIGS. 12 to 14 show a cooling device 1 and a power converter 4 that are arranged to include a pressure regulating means 61 for regulating the supply pressure of a high-pressure fluid with respect to each of the high-pressure tubes according to a seventh embodiment of the present invention.

The power converter 4 of this embodiment includes a plurality of semiconductor cooling units 15 arranged in a laminated structure inside a case 41. The semiconductor cooling units 15 are identical to the semiconductor control unit 15 of the third embodiment shown in FIG. 6, and each of the semiconductor cooling units 15 includes a semiconductor module 2, a pair of cooling tubes 3 and 3 disposed in contact with both surfaces of the semiconductor module 2, and a pair of high-pressure tubes 5 and 5 disposed in contact with outer surfaces of the respective cooling tubes 3.

The pressure regulating means or device 61 is provided for each of the semiconductor cooling units 15 for regulating the supply pressure of the high-pressure fluid supplied to the pair of high-pressure tubes 5, 5 of the semiconductor cooling unit 15.

More particularly, the pair of high-pressure tubes 5 of any one of the semiconductor cooling units 15 is arranged to accommodate a high-pressure fluid supplied at a pressure P1, P2, P3, P4, P5, P6 or P7 (FIG. 12) which is different from the pressure of the high-pressure fluid supplied to the pair of high-pressure tubes 5 of another semiconductor cooling unit 15. These pressures P1-P7 are independently set while monitoring temperatures of the corresponding semiconductor modules 2, so that the monitored temperature (T1, T2 . . . Tn)

of each semiconductor module 2 falls within a predetermined range. On the basis of information about the monitored temperatures (T1, T2 . . . Tn), a control unit 420 controls the pressure of the high-pressure fluid supplied to the pair of high-pressure tubes 5 and 5 of each individual semiconductor cooling unit 15 that forces the associated pair of cooling tubes 3 and 3 toward the semiconductor module 2 of the same semiconductor cooling unit 15. The supply pressure of the high-pressure fluid is also monitored so that a predetermined force or pressure can be applied from the high-pressure tubes 5 to the cooling tubes 3.

The temperature monitoring of the semiconductor modules 2 can be achieved by the use of temperature detecting devices or sensors, such as thermistors, incorporated in the respective semiconductor modules 2.

As shown in FIGS. 13 and 14, the semiconductor module 2 comprises a so-called "two-in-one" semiconductor module having two semiconductor devices such as IGBTs 201 each coupled with one of two diodes 202. The semiconductor module 2 has control terminals 21 and electrode terminals 22. The cooling tubes 3 are in contact with both surfaces of the semiconductor module 2 in such a manner as to cover a body portion 20 of the semiconductor module 20. The coolant inlet portion 331 and the coolant outlet portion 332 that are provided for the pair of cooling tubes 3, 3 are connected to a coolant supply header 141 and a coolant discharge header 142, respectively.

Other parts of the seventh embodiment are the same as those parts of the first embodiment described above with reference to FIG. 1.

According to the seventh embodiment, since the cooling device 1 is equipped with the pressure regulating means or devices 61, even after the assembly of the cooling device 1 relative to the power converter 4, the supply pressure of the high-pressure fluid can be adjusted in such a manner as to accommodate or take up variations in cooling efficiency caused due to the difference in parallelism or warpage of the heat radiating surfaces 24 (FIGS. 12 and 14) between the individual semiconductor modules 2.

By virtue of the regulation of the supply pressure of the high-pressure fluid, it is also possible to lower the level of various requirements for the heat release design. For example, the amount of heat transfer grease applied between the semiconductor modules 2 and the cooling tubes 3 in the assembly process of the power converter 4 can be reduced, and a wider range of tolerance limits can be used for manufacturing accuracies including the parallelism and warpage of the heat radiating surfaces of the semiconductor modules 2.

Furthermore, if any one of the semiconductor modules 2 undergoes undue thermal expansion during operation of the power converter 4, a force or pressure acting between the thermally expanded semiconductor module 2 and the associated cooling tubes 3 can be adjusted to take up the thermal expansion of the semiconductor module 2. To this end, when the semiconductor module 2 undergoes thermal expansion, the supply pressure of the high-pressure fluid that is supplied to the high-pressure tubes 5 on the thermally expanded semiconductor module 2 is reduced. Alternatively, if any one of the semiconductor modules 2 undergoes thermal contraction, then the supply pressure of the high-pressure fluid supplied to the high-pressure tubes 5 associated with the thermally contracted semiconductor module 2 is increased. By thus regulating the supply pressure of the high-pressure fluid, it is possible to maintain the force or pressure acting between each respective semiconductor module 2 and the associated cooling tubes 3 within a predetermined range.

In the case where the semiconductor modules 2 have different heat values and hence create a large temperature difference between the adjacent semiconductor modules 2, the pressures of the high-pressure fluid supplied to the respective pairs of the high-pressure tubes 5 can be adjusted independently from one another so that the force or pressure acting between each individual semiconductor module 2 and the associated pair of cooling tubes 3 can be set in accordance with the heat value of a corresponding one of the semiconductor modules 2. By thus setting the pressures on the respective semiconductor modules 2, it is possible to properly relieve a stress created due to thermal expansion of any one of the semiconductor modules 2.

Furthermore, the high-pressure tubes 5 provided in pairs on each individual semiconductor cooling unit 15 are so constructed as to accommodate high-pressure fluids of different pressures. Thus, the force or pressure applied from each individual high-pressure tube 5 to the associated cooling tube 3 (and, hence, a force applied from each individual cooling tube 3 to the associated semiconductor module 2) can be adjusted such that variations in the parallelism of the heat radiating surfaces 24 between the respective semiconductor modules 2 or variations in the amount of warp of the heat radiating surfaces 24 between the respective semiconductor modules 2 can be taken up or accommodated. This arrangement will further improve the cooling efficiency of the semiconductor modules 2.

Further advantageous effects that can be also achieved by the seventh embodiment are the same as those already described above with respect to the first embodiment and further description thereof can be omitted.

Eighth Embodiment

Figure 15:
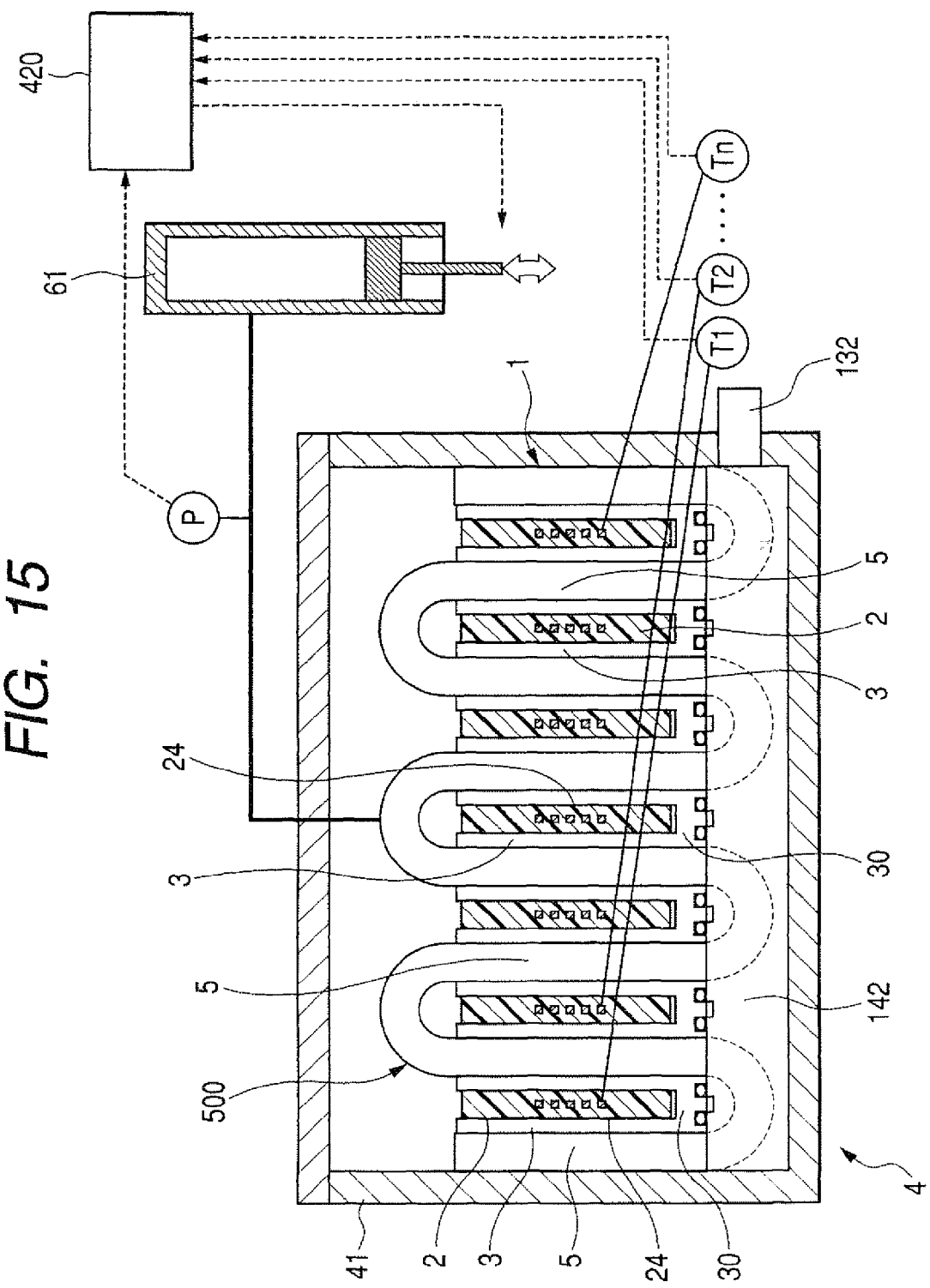
FIG. 15 is a diagrammatic cross-sectional view of a power converter according to an eighth embodiment of the present invention.

FIG. 15 shows a cooling unit 1 and a power converter 4 equipped with the cooling unit 1 according to an eighth embodiment of the present invention. The cooling device 1 includes a plurality of cooling tubes 3 each disposed in contact with one heat radiating surface 24 of a plurality of semiconductor modules 2, and a single continuous a single continuous high-pressure tube 500 bent into a meandering configuration including a series of longitudinal high-pressure tube portions 5 each disposed in contact with at least one of two adjacent cooling tubes 3 of the plurality of cooling tubes.

The high-pressure tube 500 is connected to a single pressure regulating means or device 60. Since all of the high-pressure tube portions 5 are formed as integral part of the continuous high-pressure tube 500, all of the cooling tubes 3 receive the same force or pressure from the associated high-pressure tube portions 5 of the high-pressure tube 500.

All of the semiconductor modules 2 are monitored for a sign of temperature variation. On the basis of a comprehensive analysis of the monitored temperature information, the control unit 40 controls operation of the pressure regulating unit 61 in such a manner that the pressure P of the high-pressure fluid supplied to the high-pressure tube 500 is properly regulated to prevent undue temperature rise which would otherwise occur in any one of the semiconductor modules 2.

Other parts of the eighth embodiment are the same as those already described above with respect to the seventh embodiment and hence no further description thereof is needed.

It will be appreciated that the power converter 4 equipped with the cooling device 1 of the eighth embodiment is also able to prevent thermal interference between the adjacent semiconductor modules 2 and also is easy to regulate the cooling efficiency of the semiconductor modules 2.

Further advantageous effects that can be also achieved by the eighth embodiment are the same as those described above with respect to the first embodiment and further description thereof can be omitted.

Ninth Embodiment

Figure 16:
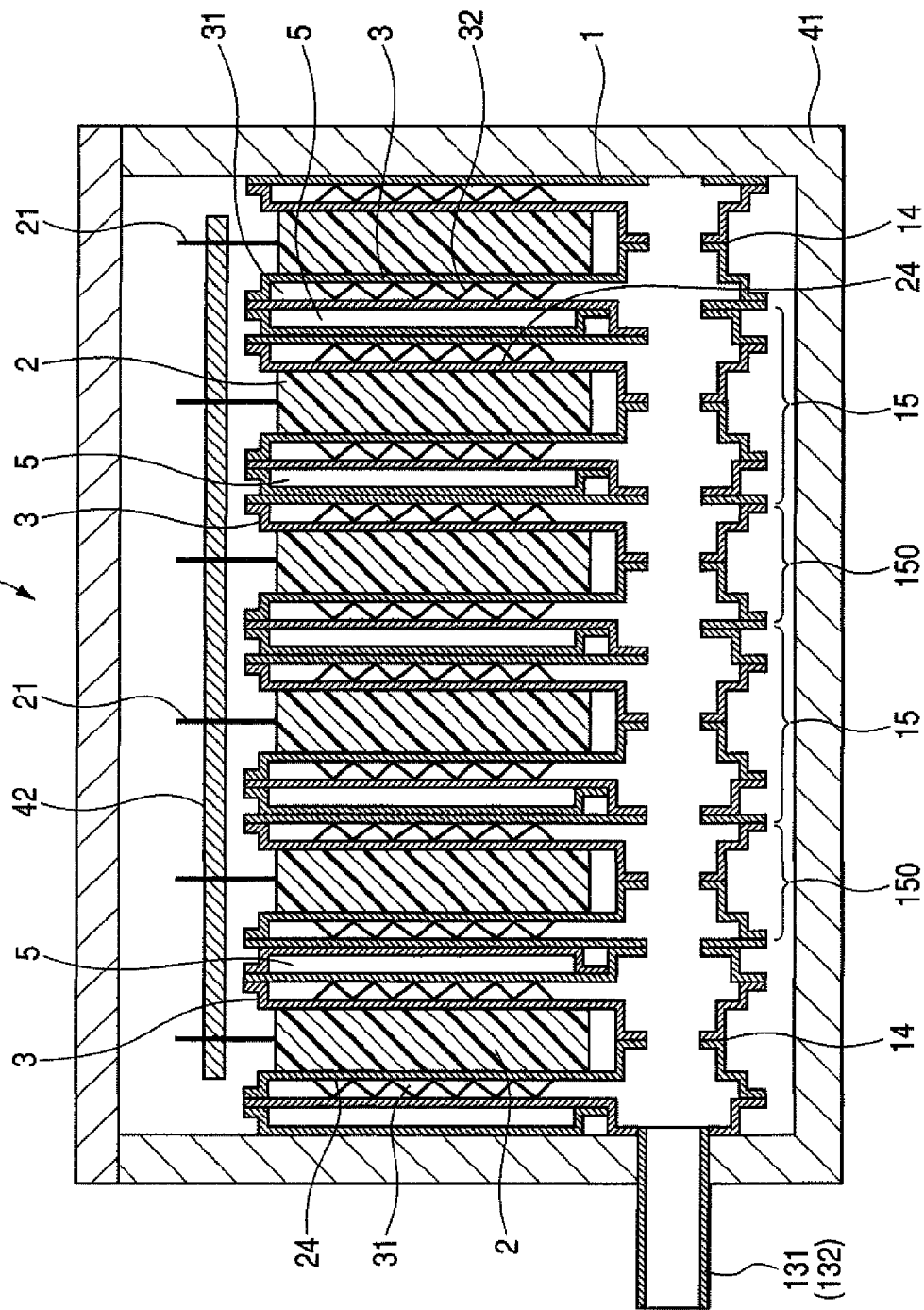
FIG. 16 is a cross-sectional view of a cooling device and a power converter equipped with the cooling device according to a ninth embodiment of the present invention.

FIG. 16 illustrates a cooling device 1 and a power converter 4 equipped with the cooling device 1 according to a ninth embodiment of the present invention. According to one feature of this embodiment, a plurality of high-pressure tubes 5, each disposed between two cooling tubes 3 that are disposed on two opposed surfaces of each pair of adjacent semiconductor modules 2, have a single ply or layer structure. By contrast, the high-pressure tubes 5 in the first embodiment shown in FIG. 1 have a double layer structure that is twice as thick as the single layer structure of the high-pressure tubes 5 in this embodiment.

More specifically, the cooling device 1 is composed of alternating layers of first semiconductor cooing units 15 and second semiconductor cooling units 150. Each of the first semiconductor cooling units 15 includes a single semiconductor module 2, a pair of cooling tubes 3 disposed on both surfaces (heat radiating surfaces) 24 of the semiconductor module 2, and a pair of high-pressure tubes 5 disposed on outer surfaces of the respective cooling tubes 3. On the other hand, each of the second semiconductor cooling units 150 includes a single semiconductor module 2 and a pair of cooling tubes 3 disposed on both surfaces (heat radiating surfaces) 24 of the semiconductor module 2.

Other parts of the ninth embodiment are the same as those described above with respect to the first embodiment and, hence, no further description is needed.

By virtue of the single layer structure employed in the high-pressure tubes 5, the ninth embodiment can achieve noticeable downsizing of the cooling device 1 and the power converter 4 equipped with the cooling device 1.

Tenth Embodiment

A cooling device according to a tenth embodiment of the present invention will be described below with references to FIGS. 17-21 and 22A-22B. In brief, the cooling device 1 in this embodiment is arranged to urge a cooling tube 3 against a semiconductor module 2 by means of a presser tube 6 filled with a thermowax 61 that expands and contracts according to the temperature of a cooling medium or coolant circulating through the cooling tube 3.

Figure 17:
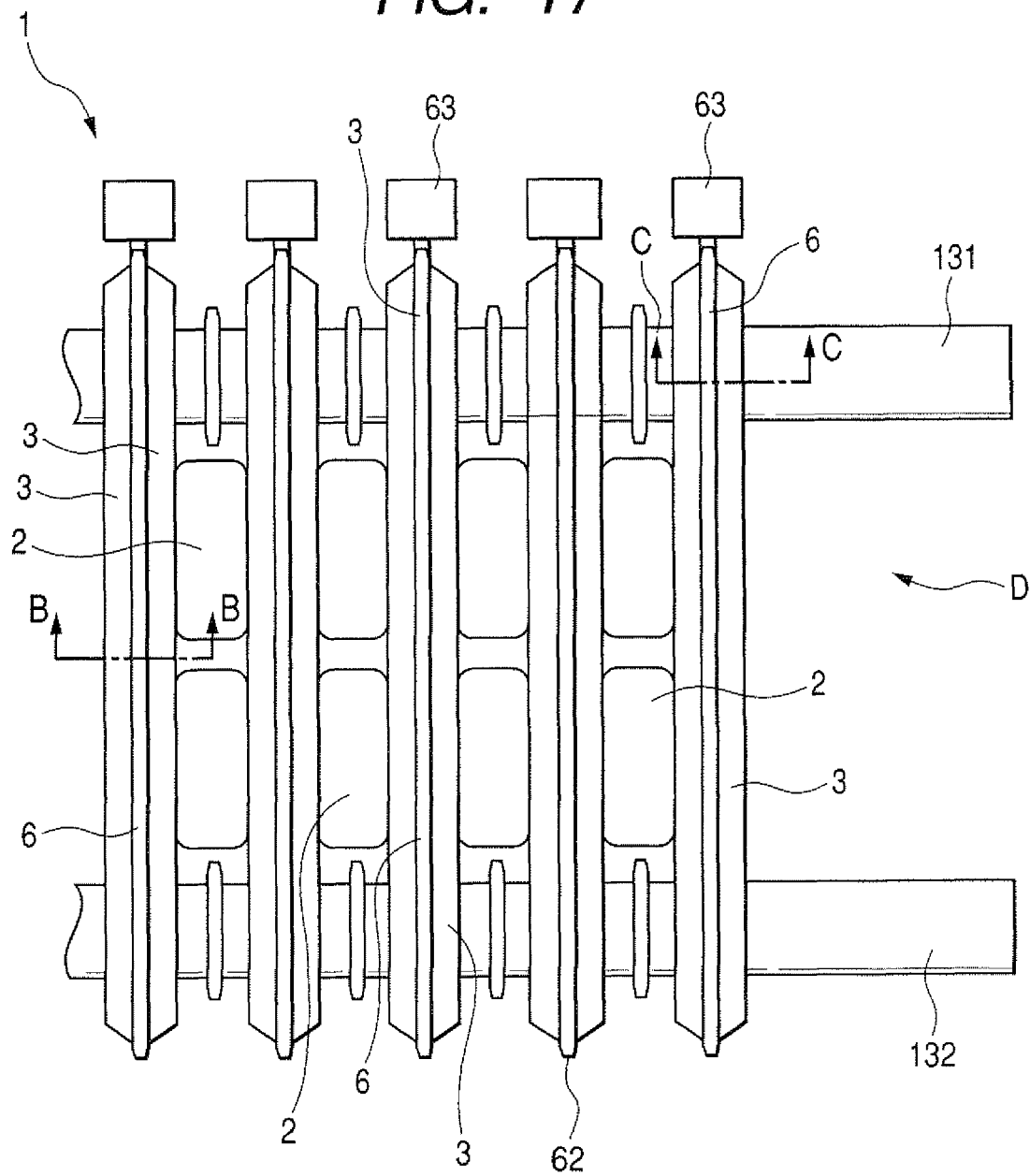
FIG. 17 is a fragmentary front elevational view of a cooling device according to a tenth embodiment of the present invention.
Figure 18:
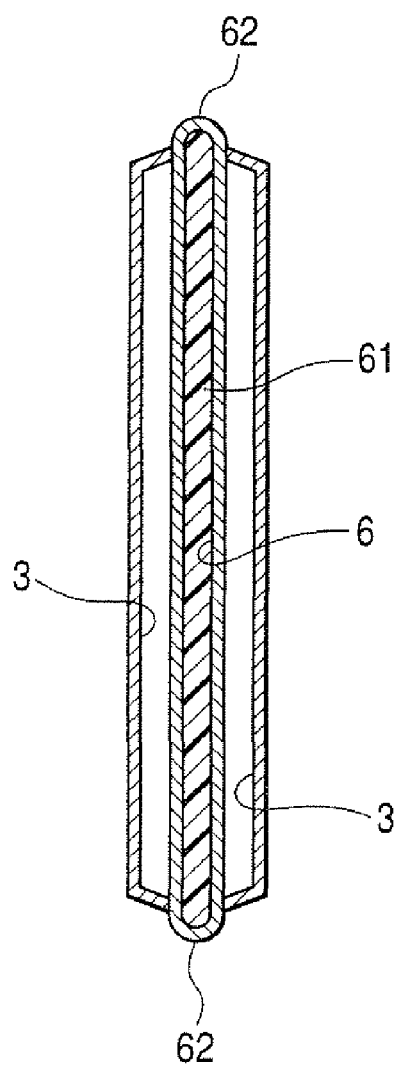
FIG. 18 is a cross-sectional view taken along line B-B of FIG. 17.
Figure 19:
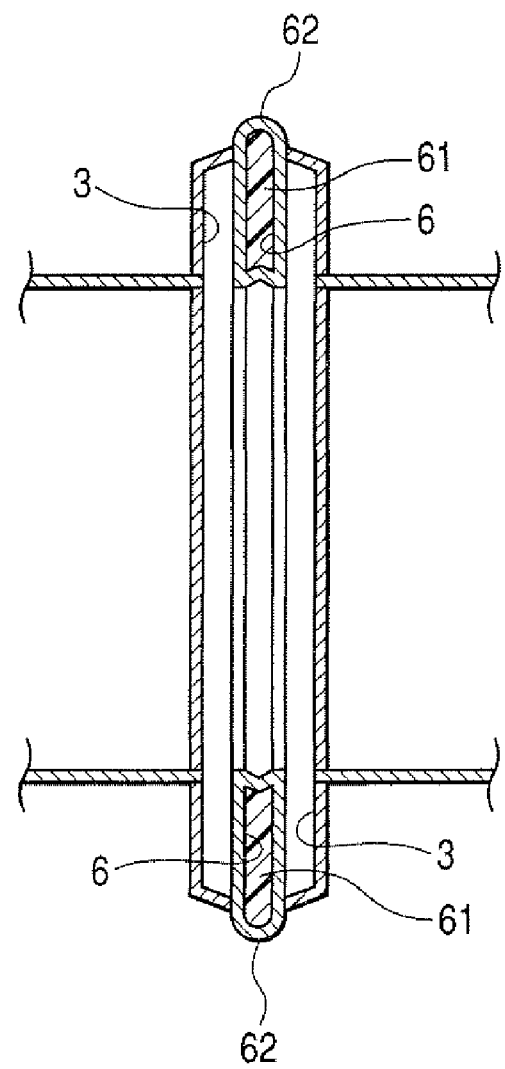
FIG. 19 is a cross-sectional view taken along line C-C of FIG. 17.

More specifically, as shown in FIGS. 17-19, the cooling device 1 generally comprises a cooling tube 3 adapted to be disposed in contact with a semiconductor module 2, and a presser tube 6 disposed adjacent to a surface of the cooling tube 3 that faces away from the semiconductor module 2. The presser tube has a hollow interior filled with a thermowax 61 (FIGS. 18 and 19) that expands and contracts according to the temperature of the coolant medium flowing through the cooling tube 3. The presser tube 6 is capable of expanding and contracting in a laminating direction perpendicular to the surface of the cooling tube 3 whereby the expansion and contraction of the thermowax 61 causes the presser tube 6 to expand and contract in the laminating direction (thickness direction of the presser tube 6).

Figure 22A:
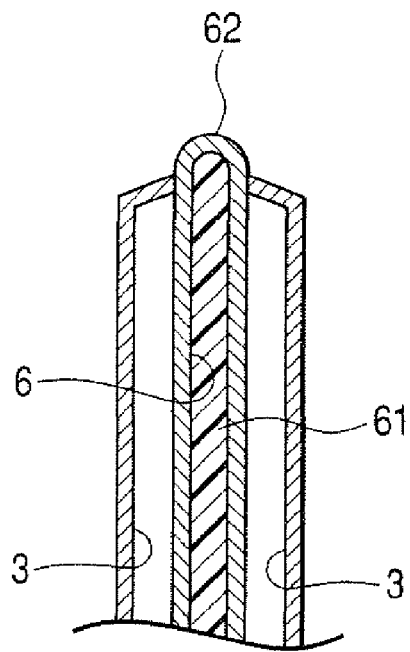
FIG. 22A is a cross-sectional view showing part of the cooling device of the tenth embodiment including a presser tube as it is in a contracted position.
Figure 22B:
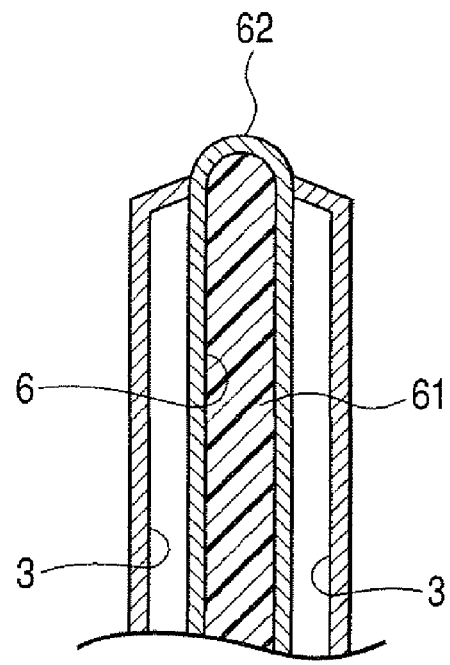
FIG. 22B is a view similar to FIG. 22A but showing the presser tube disposed in an expanded position.

As shown in FIGS. 17-19, the cooling tube 3 and the presser tube 6 are formed integrally with each other such that two cooling tubes 3 and 3 are disposed on both sides (in the laminating or thickness direction) of each individual presser tube 6. The presser tube 6 has a pair of diaphragm portions 62 and 62 formed at opposite ends in a length direction thereof. The diaphragm portions 62 are deformable to facilitate the contraction and expansion of the presser tube 6 in the laminating direction (width direction of the pressure tube 6), as shown in FIGS. 22A and 22B.

Figure 20:
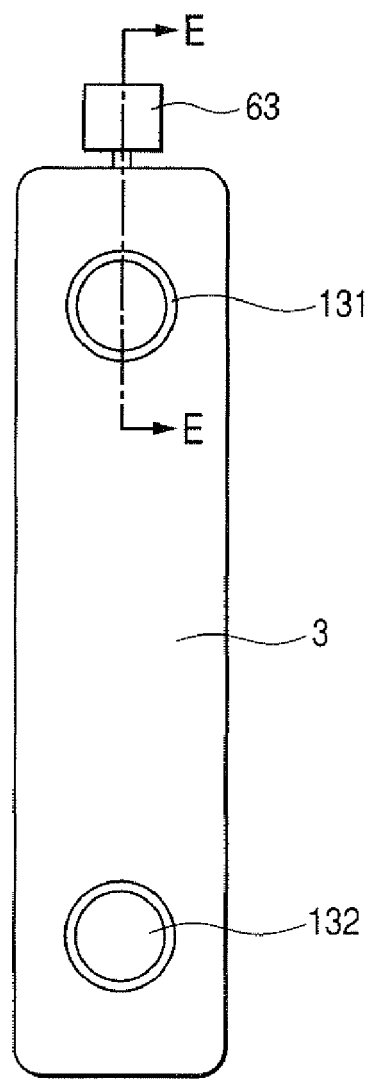
FIG. 20 is a side view in the direction of the arrow D in FIG. 17.
Figure 21:
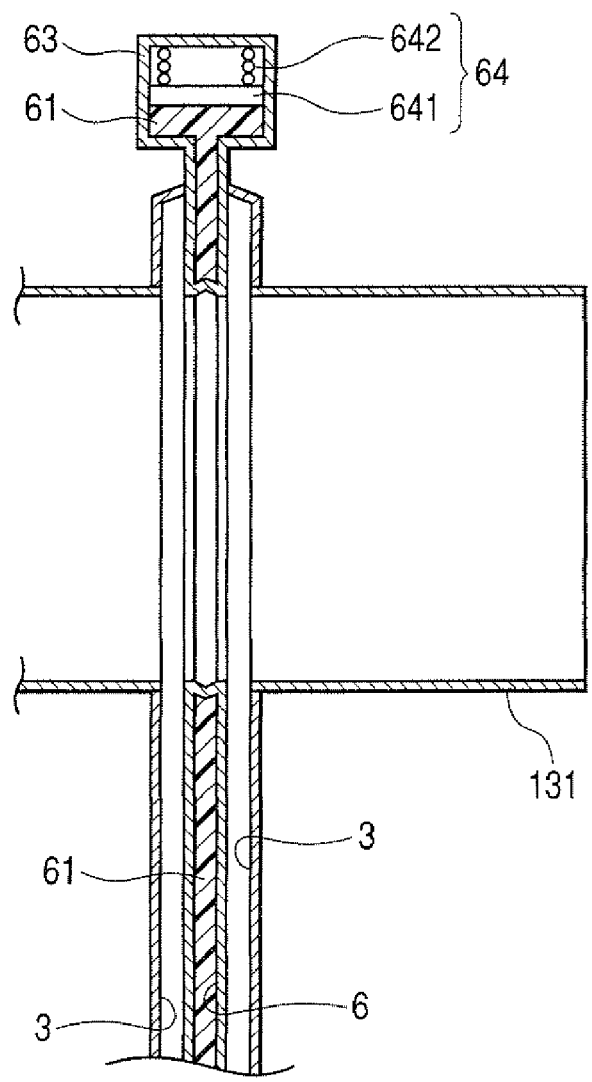
FIG. 21 is a cross-sectional view taken along line E-E of FIG. 20.

As shown in FIGS. 17, 20 and 21, the presser tube 6 has a buffer section 63 for temporarily accommodating therein part of the thermowax 61 (FIG. 21) when the thermowax 61 undergoes undue expansion due to the effect of the heat from the cooling medium circulating through the associated cooling tubes 3, 3. The buffer section 63 has a return mechanism 64 for returning the thermowax 61 from the buffer section 63 to the hollow interior of the presser tube 6 when the thermowax 61 held within the presser tube 6 contracts. In the illustrated embodiment, the return mechanism 64 includes a piston 641 slidably received in the buffer section 63, and a compression coil spring 642 received in the buffer section 63 and acting between the buffer section 63 and the piston 641 to urge the piston 641 in a direction toward the presser tube 6.

The thermowax 61 may include a waxy solid or semisolid resin compound made from fatty acids and prepared to possess flowability which changes suddenly at a specific temperature (for example, 60 to 65° C.) to ensure the volumetric change depending on the temperature.

Other structural parts of the tenth embodiment are substantially the same as those described above with respect to the first embodiment and no further description is needed.

The cooling device 1 of the foregoing construction operates as follows.

The cooling device 1 utilizes the expansion of the thermowax 6 within the presser tube 6 to urge each of the pair of cooling tubes 3 against an adjacent one of the semiconductor modules 2. More specifically, when the temperature of the semiconductor module 2 rises to thereby increase the temperature of the cooling medium circulating through the cooling tubes 3, the thermowax 61 shielded within the presser tube 6 disposed adjacent to the cooling tubes 3 is heated. When the thermowax 61 is heated, it expands causing the presser tube 6 to expand in a width direction (laminating direction) thereof, as shown in FIG. 22B. In this instance, the diaphragm portions 62 formed as integral part of the pressure tube deform or deflect to thereby facilitate the widthwise expansion of the presser tube 6.

With this expansion of the presser tube 6, a force or pressure is exerted from the presser tube 6 onto the cooling tube 3 on either side thereof in a direction to urge the cooling tube 3 against the semiconductor module 2. The thus urged cooling tube 3 is able to sufficiently follow or fit the surface configuration of a heat radiating surface of the semiconductor module 2 with the result that the thermal resistance between the cooling tube 3 and the semiconductor module 2 is reduced and the cooling efficiency of the cooling device 1 is increased.

By the use of the thermowax 61, it is possible to increase the cooling efficiency in conjunction with cooling needs, which increase as the temperature of the semiconductor module 2 increases.

As the temperature of the semiconductor module 2 falls, the thermowax 61 cools down and contracts, causing the presser tube 6 to contract or shrink in widthwise direction, as shown in FIG. 22A.

Even when the parallelism of the opposite heat radiating surfaces of any one of the semiconductor modules 2 is relatively low or either heat radiating surface has a warp, the associated cooling tubes 3 are able to follow the surface configurations of the heat radiating surfaces to thereby take up or minimize a clearance between the semiconductor module 2 and the cooling tubes 3.

Furthermore, since the presser tube 6 and the associated cooling tubes 3 on both sides thereof are in contact with each other, the thermowax 61 filled in the presser tube 6 forms a thermal resistance which is large enough to prevent a temperature rise from occurring in the coolant circulating through the cooling tube 3 on one side of the presser tube 6 due to the effect of heat emitted from the semiconductor module 2 which is in contact with the cooling tube 3 on the opposite side of the presser tube 6. By thus forming the thermal resistance, it is possible to prevent thermal interference between the semiconductor module 2 contacting the cooling tube 3 at one side of the pressure tube 6 and the semiconductor module 2 contacting the cooling tube 3 at the other side of the presser tube 6.

Additionally, by virtue of the buffer section 63 provided on the presser tube 6, the presser tube 6 is kept free from rupturing even when the thermowax 61 undergoes undue expansion due to, for example, overheating of the semiconductor module 2. Furthermore, thanks to the return mechanism 64 associated with the buffer section 63, that part of the thermowax 61, which has been accommodated in the buffer section 61 and hence has flowability inferior to that of a major part of the thermowax 61 held within the presser tube 6, can be smoothly returned from the buffer section 63 to the presser tube 6 in immediate response to the occurrence of the next contraction of the major part of the thermowax 61.

As is apparent from the foregoing description, the cooling device 1 of the tenth embodiment is able to prevent thermal interference between the adjacent semiconductor modules 2 and also is easy to regulate the cooling efficiency of the semiconductor modules 2.

Further advantageous effects that can be also achieved by the tenth embodiment are the same as those already described above with respect to the first embodiment and hence further description thereof can be omitted.

Eleventh Embodiment

Figure 23A:
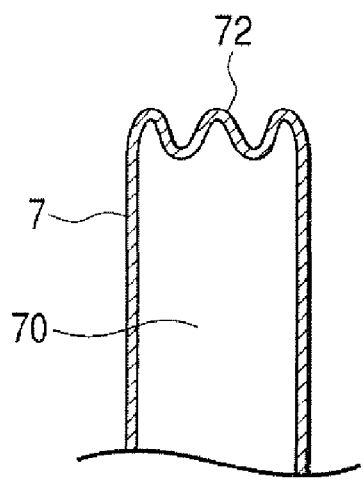
FIG. 23A is a cross-sectional view showing part of a presser member according to an eleventh embodiment of the present invention as it is disposed in a contracted position.
Figure 23B:
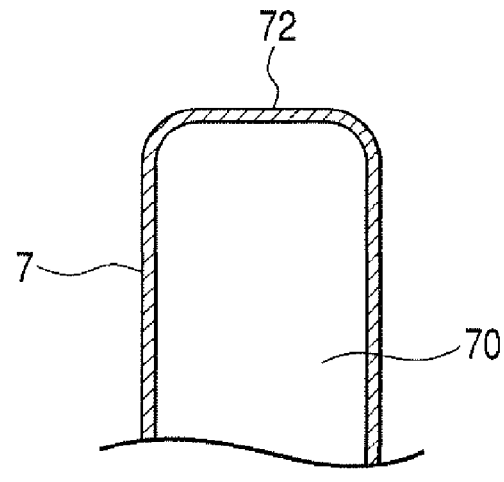
FIG. 23B is a view similar to FIG. 23A but showing the presser member disposed in an expanded position.

An eleventh embodiment of the present invention will be described below with reference to FIGS. 23A and 23B. This embodiment relates to a modification of the cooling device 1 of the tenth embodiment shown in FIGS. 17-21 and 22A-22B. To realize the modification, a presser member 7 is used in place of the presser tube 6 filled with thermowax 61 of the tenth embodiment. The presser member 7 is formed from a shape memory alloy having a spring characteristic, which expands, and contracts according to thermal loads applied thereto. As shown in FIGS. 23A and 23B, the pressure member 7 comprises a tubular member having a hollow interior space 70. Though not shown in FIGS. 23A and 23B, the tubular presser member 7 is disposed between a pair of cooling tubes (identical to the cooling tubes 3 shown in FIGS. 22A and 22B). The tubular pressure member 7 includes a pair of diaphragm portions 72 (only one being shown) formed at opposite ends in a length direction thereof which is perpendicular to a widthwise direction (laminating direction) of the tubular pressure member 7.

The spring characteristic of the shape memory alloy from which the pressure member 7 is formed is determined such that when the presser member 7 is subjected to a low temperature, the diaphragm portions 72 contract in the widthwise direction of the pressure member 7 to assume a corrugated configuration shown in FIG. 23A, and when the presser member 7 is subjected to a high temperature, the diaphragm portions 72 expand in the widthwise direction of the presser member 7 to assume a linearly stretched configuration shown in FIG. 23B.

The temperature-dependent contraction and expansion of the diaphragm portions 72 cause the entire presser member 7 to contract and expand in the widthwise direction. In this arrangement, the force or pressure acting from the presser member 7 onto the cooling tubes on both sides (which in turn urges the cooling tubes against two adjacent ones of the semiconductor modules) can be changed changes depending on the temperature.

Operation and effects achieved of the eleventh embodiment of the foregoing construction will be described below in conjunction with the cooling device 1 of the tenth embodiment shown in FIGS. 17-22 as modified to have the presser member 7 of the eleventh embodiment in place of the pressure tube 6.

The modified cooling device 1 includes a presser member 7 formed from a shape memory alloy and disposed adjacent to a surface of the cooling tube 3 that faces away from the semiconductor module 2. The presser member 7 possesses a spring characteristic, which expands and contracts according to the temperature of the cooling medium. The expansion of the presser member 7 urges each of one pair of cooling tubes 3 against an adjacent one of the semiconductor modules 2. More specifically, when the temperature of the semiconductor module 2 rises to thereby increase the temperature of the cooling medium circulating through the cooling tubes 3, the presser member 7 of shape memory alloy disposed adjacent to the cooling tubes 3 is heated. When heated, the presser member 7 expands in a widthwise direction (laminating direction), as shown in FIG. 23B. With this expansion of the presser member 7, a force or pressure is exerted from the presser member 7 onto the cooling tube 3 on either side thereof in a direction to urge the cooling tube 3 against the semiconductor module 2. The thus urged cooling tube 3 is able to sufficiently follow or fit the surface configuration of a heat radiating surface of the semiconductor module 2 with the result that the thermal resistance between the cooling tube 3 and the semiconductor module 2 is reduced and the cooling efficiency of the cooling device 1 is increased. By the use of the presser member 7 of shape memory alloy, it is possible to increase the cooling efficiency in conjunction with cooling needs, which increase as the temperature of the semiconductor module 2 increases.

Even when the parallelism of the opposite heat radiating surfaces of any one of the semiconductor modules 2 is relatively low or either heat radiating surface has a warp, the associated cooling tubes 3 are able to follow the surface configurations of the heat radiating surfaces to thereby take up or minimize a clearance between the semiconductor module 2 and the cooling tubes 3.

Furthermore, since the presser member 7 and the associated cooling tubes 3 on both sides thereof are in contact with each other, and since the presser member 7 has a tubular shape having a hollow interior space 70, the hollow interior space 70 provides a thermal resistance which is large enough to prevent a temperature rise from occurring in the coolant circulating through the cooling tube 3 on one side of the presser member 7 due to the effect of heat emitted from the semiconductor module 2 which is disposed in contact with the cooling tube 3 on the opposite side of the presser member 7. By thus providing the thermal resistance, it is possible to prevent thermal interference between the semiconductor module 2 contacting the cooling tube 3 at one side of the pressure member 7 and the semiconductor module 2 contacting the cooling member 3 at the other side of the presser member 7.

Obviously, various minor changes and modifications are possible in the light of the above teaching. It is to be understood that within the scope of the appended claims the present invention may be practiced otherwise than as specifically described.

What is claimed is:

1. A cooling device for cooling an electronic component, comprising:
a cooling tube adapted to be disposed in contact with the electronic component and having an internal coolant flow channel for the passage therethrough of a cooling medium; and
a high-pressure tube disposed adjacent to a surface of the cooling tube that faces away from the electronic component, the high-pressure tube having a hollow interior filled with a high-pressure fluid having a pressure maintained at a predetermined pressure higher than that of the cooling medium, wherein when the high-pressure fluid is introduced into the high-pressure tube with its pressure being kept at the predetermined pressure, the high-pressure tube undergoes radial expansion and forces the adjacent cooling tube toward the electronic component for the cooling tube to closely engage a heat radiating surface of the electronic component.

2. The cooling device according to claim 1, wherein the cooling tube includes a first cooling tube adapted to be disposed in contact with one surface of the electronic component, and a second cooling tube adapted to be disposed in contact with the opposite surface of the electronic component.

3. The cooling device according to claim 2, wherein the first and second cooling tubes disposed in contact with both surfaces of the electronic component are formed by part of a tube of U-shaped configuration having a pair of stems and a bent portion interconnecting the stems at one end thereof.

4. The cooling device according to claim 2, wherein the first and second cooling tubes disposed in contact with both surfaces of the electronic component are formed by part of a tube of ring-shaped configuration.

5. The cooling device according to claim 2, wherein the high-pressure tube includes a first high-pressure tube disposed in contact with the surface of the first cooling tube and a second high-pressure tube disposed in contact with the surface of the second cooling tube, the first and second high-pressure tubes being formed by part of a tube of U-shaped configuration having a pair of stems and a bent portion interconnecting the stems at one end thereof.

6. The cooling device according to claim 2, wherein the high-pressure tube includes a first high-pressure tube disposed in contact with the surface of the first cooling tube and a second high-pressure tube disposed in contact with the surface of the second cooling tube, the first and second high-pressure tubes being formed by part of a tube of ring-shaped configuration.

7. The cooling device according to claim 1, for use with a plurality of electronic components, wherein the cooling tube includes a plurality of cooling tubes adapted to be disposed in contact with respective ones of the plurality of electronic components, and the high-pressure tube includes a plurality of high-pressure tubes disposed in contact with respective ones of the plurality cooling tubes, each of the high-pressure tubes being capable of accommodating a high-pressure fluid filled therein at a pressure different from a pressure of the high-pressure fluid filled in another high-pressure tube.

8. The cooling device according to claim 1, for use with a plurality of electronic components, wherein the cooling tube includes a plurality of cooling tubes adapted to be disposed in contact with respective ones of the plurality of electronic components, and the high-pressure tube is inserted between each pair of adjacent cooling tubes of the plurality of cooling tubes that are disposed in contact with two adjacent electronic components of the plurality of electronic components.

9. The cooling device according to claim 1, for use with a plurality of electronic components, wherein the cooling tube includes a plurality of cooling tubes adapted to be disposed in contact with respective ones of the plurality of electronic components, and the high-pressure tube is comprised of a single continuous high-pressure tube bent into a meandering configuration including a series of longitudinal high-pressure tube portions each disposed in contact with at least one of two adjacent cooling tubes of the plurality of cooling tubes.

10. The cooling device according to claim 1, further comprising pressure regulating means for regulating a pressure of the high-pressure fluid filled in the high-pressure tube such that the pressure of the high-pressure fluid filled in the high-pressure tube is maintained at the predetermined pressure.

11. The cooling device according to claim 1, wherein the high-pressure fluid is compressed air.

12. An electric power converting device comprised of a plurality of semiconductor modules each having a semiconductor device incorporated therein, and the cooling device of claim 1 as means for cooling the semiconductor modules.

13. A cooling device for cooling an electronic component, comprising:
a cooling tube adapted to be disposed in contact with the electronic component and having an internal coolant flow channel for the passage therethrough of a cooling medium; and
a high-pressure tube disposed adjacent to a surface of the cooling tube that faces away from the electronic component, the high-pressure tube having a hollow interior filled with a high-pressure fluid having a pressure higher than that of the cooling medium;
wherein the cooling tube includes a first cooling tube adapted to be disposed in contact with one surface of the electronic component, and a second cooling tube adapted to be disposed in contact with the opposite surface of the electronic component; and
wherein the high-pressure tube includes a first high-pressure tube disposed in contact with the surface of the first cooling tube and a second high-pressure tube disposed in contact with the surface of the second cooling tube, the first and second high-pressure tubes being formed by part of a tube of U-shaped configuration having a pair of stems and a bent portion interconnecting the stems at one end thereof.

14. A cooling device for cooling an electronic component, comprising:
a cooling tube adapted to be disposed in contact with the electronic component and having an internal coolant flow channel for the passage therethrough of a cooling medium; and
a high-pressure tube disposed adjacent to a surface of the cooling tube that faces away from the electronic component, the high-pressure tube having a hollow interior filled with a high-pressure fluid having a pressure higher than that of the cooling medium;
wherein the cooling tube includes a first cooling tube adapted to be disposed in contact with one surface of the electronic component, and a second cooling tube adapted to be disposed in contact with the opposite surface of the electronic component; and
wherein the high-pressure tube includes a first high-pressure tube disposed in contact with the surface of the first cooling tube and a second high-pressure tube disposed in contact with the surface of the second cooling tube, the first and second high-pressure tubes being formed by part of a tube of ring-shaped configuration.

* * * * *